United States Patent
Nakamura et al.

[11] Patent Number: 5,455,789
[45] Date of Patent: Oct. 3, 1995

[54] NONVOLATILE SEMICONDUCTOR MEMORY WITH SELECTIVELY DRIVEN WORD LINES

[75] Inventors: Takeshi Nakamura, Kokubunji; Masashi Wada; Masahito Takahashi, both of Kodaira; Hiroshi Sato, Ohme; Takeshi Furuno, Koganei, all of Japan

[73] Assignees: Hitachi, Ltd.; Hitachi ULSI Engineering Corp., both of Tokyo, Japan

[21] Appl. No.: 241,274

[22] Filed: May 10, 1994

[30] Foreign Application Priority Data

May 28, 1993 [JP] Japan ................................. 5-151296

[51] Int. Cl.⁶ .................................................. G11C 7/00
[52] U.S. Cl. .............. 365/185.17; 365/218; 365/230.06; 365/189.11; 365/189.09
[58] Field of Search ..................... 365/185, 189.09, 365/189.11, 230.06, 218

[56] References Cited

U.S. PATENT DOCUMENTS 4,893,275  1/1990  Tanaka et al. .......................... 365/185
5,038,327  8/1991  Akaogi .................................... 365/185
5,077,691  12/1991 Haddad et al. ......................... 365/185
5,253,200  10/1993 Arakawa ................................ 365/185
5,265,052  11/1993 D'Arrigo et al. ................... 365/189.11

FOREIGN PATENT DOCUMENTS 3-219496  of 0000  Japan .

Primary Examiner—David C. Nelms
Assistant Examiner—Vu Le
Attorney, Agent, or Firm—Fay, Sharpe, Beall, Fagan, Minnich & McKee

[57] ABSTRACT

Two paths for receiving the outputs of a logic select circuit LOGS are individually equipped in a symmetric manner with output MOSFETs Q52 and Q53, feedback MOSFETs Q54 and Q55 and isolating MOSFETs Q56 and Q57, the paired of which have conduction types different from each other. Negative erasing Vee voltage and programming Vpp voltage to be fed to the paths through the feedback MOSFETs are prevented without fail from being transmitted to a logic select circuit by the paired isolating MOSFETs of the different conduction types. As the elements for selecting the positive or negative logic output of the logic select circuit, CMOS transfer gates TG1 and TG2 can be adopted to maximize the amplitude of the output logic signal of the logic select circuit with respect to an operating power.

20 Claims, 11 Drawing Sheets

FIG. 3

| | SELECTED | UNSELECTED | XM | Xp | DE | P4 ● | P1 ◉ | P3 ○ | P2 ◉ | WORD LINE |
|---|---|---|---|---|---|---|---|---|---|---|
| PROGRAM | ○ | | L | H | L | Vcc | Vpp | Vcc | Vss | Vpp |
| | | ○ | H | H | | | | | | Vss |
| | | ○ | L/H | L | | | | | | Vss |
| ERASE | ○ | | L | H | H | Vss | Vcc | Vss | Vee | Vee |
| | | ○ | H | H | | | | | | Vcc |
| | | ○ | L/H | L | | | | | | Vcc |
| READ | ○ | | L | H | L | Vcc | Vcc | Vcc | Vss | Vcc |
| | | ○ | H | H | | | | | | Vss |
| | | ○ | L/H | L | | | | | | Vss |

FIG. 6

|  | SELECTED/UNSELECTED | BIAS CONDITION | | |
|---|---|---|---|---|
|  |  | CONTROL GATE | DRAIN | SOURCE |
| READ | SELECTED | Vcc (3.3V) | Vcc-β (1V) | Vss (0V) |
| READ | UNSELECTED | Vss | Vcc-β | Vss |
| PROGRAM | SELECTED | Vpp (12V) | Vcc+α (4V) | Vss |
| PROGRAM | UNSELECTED | Vpp | Vss | Vss |
| ERASE | SELECTED | Vee (-10V) | OPEN | Vcc |
| ERASE | UNSELECTED | Vcc | OPEN | Vcc | ated to a technology which is effective if applied to
NONVOLATILE SEMICONDUCTOR MEMORY WITH SELECTIVELY DRIVEN WORD LINES

BACKGROUND OF THE INVENTION

The present invention relates to an electrically programmable nonvolatile semiconductor memory device and, more particularly, to a technology which is effective if applied to a flash memory equipped with a word driver for feeding a positive voltage in a program mode and a negative voltage in an erase mode.

A flash memory to be used as an electrically programmable nonvolatile semiconductor memory device can be electrically programmed like an EEPROM (i.e., Electrically Erasable and Programmable Read Only Memory) composed of memory cells as MNOS (i.e., Metal Nitride Oxide Semiconductor). Moreover, one memory cell is constructed of one element like an EPROM (i.e., Erasable and Programmable Read Only Memory) composed of an FAMOS (i.e., Floating gate Avalanche injection Metal Oxide Semiconductor) as its memory cell. The memory cell for such flash memory has the floating gate field effect transistor structure like the FAMOS type, and the programming is carried out by injecting hot electrons generated in the vicinity of the drain junction into the floating gate, and the erasure is carried out by establishing a high electric field between the floating gate and the source and by making use of the tunnel phenomenon through the thin gate oxide film to extract the electrons stored in the floating gate to the source. By the programming operation, the memory cell is given a higher threshold voltage, as viewed from its control gate, than that of the memory cell which is left in the erasing state because it is not programmed. In either the programming or erasing state, the memory transistor has its threshold voltage set to a positive voltage level. Specifically, the threshold voltage in the programming state is higher whereas the threshold voltage in the erasing state is lower than the word line selecting level which is fed from the word line to the control gate. Thanks to this relation between both the threshold voltage and the word line selecting level, a memory cell can be constructed of one transistor without adopting any select transistor.

The technology using a negative voltage is disclosed as one for erasing the aforementioned flash memory in Japanese Patent Laid-Open No. 219496/1991. According to this disclosure, when a batch erasing operation is to be effected in the nonvolatile semi-conductor memory device such as the flash memory, the voltage to be applied to the source region (or the drain region) of each memory cell is fed from the Vcc power source (i.e., the power source at 5 V fed from the outside of the chip and usually used for the reading operation), and an erase voltage (e.g., at −7 V) having a polarity opposed to that of the aforementioned Vcc power source is applied to the control gate electrode of each memory cell and is fed from a voltage converter (or booster) in the aforementioned nonvolatile semiconductor memory device. According to this construction, it is possible to unify the power supply voltage to 5 V and to reduce the erasure unit. For the batch erasing operation, the source to transmit a high leakage current is directly driven by the Vcc power source, and the control gate for establishing a high electric field between itself and the source is fed with an erase voltage having a polarity opposed to that of the Vcc power source. As a result, what flows through the control gate is a fine tunnel current which makes a direct contribution to the erasure so that the control gate can be driven by a booster circuit disposed in the nonvolatile semiconductor memory device. Thus, the chip batch erasing operation by the single Vcc power source can be realized without sacrificing the erasing rate. As compared with the erasing operation which is effected by applying a Vss voltage (e.g., at 0 V) to the control gate and a Vpp voltage (e.g., at 12 V) to the source, the source voltage can be lowered from the Vpp voltage to the Vcc voltage. As a result, it is possible to suppress remarkably the phenomenon that the positive holes established inter-band tunnel are changed into hot holes between the source and the substrate and injected into and trapped by the gate oxide film. Moreover, the erasing system, in which a high voltage is applied to the source, can erase only a relatively large block unit of 16 Kbytes, for example, in which the source lines are shared for high integration. In the negative voltage erasing system, on the contrary, the erasure can be effected at a word line unit. Since, moreover, the memory cells connected with a common word line never fails to be erased altogether, the time period for the program disturb (i.e., the phenomenon that the memory cells have their threshold voltages changed in the partially selected state of the word lines for applying the program voltage only to the control gates of the memory cells) to be experienced by the individual cells may be thought to a sum of the time periods necessary for programming the other memory cells on the same word line, so that the phenomenon that the disturb time period will increase in dependence upon the number of times for reprogramming the memory cells can be avoided to provide an excellent endurance for the reprogramming.

In the aforementioned Japanese Patent Laid-Open No. 219496/1991, there is further disclosed a structure in which circuits for selectively outputting the negative voltage Vppn necessary for the erasure and the voltages Vcc, Vpp and Vss are arranged between an address buffer and the word lines. This circuit is constructed, as shown in FIG. 11, by connecting the sources of N-channel type MOSFET Q100 and Q101 for a final stage inverter circuit INV100 and a preceding inverter circuit INV200 with the negative voltage Vppn at the erasing time.

SUMMARY OF THE INVENTION

We have investigated that not only the programming and reading operations but also the erasing operation could be carried out at the word line unit. For this, the word line to feed the negative voltage has to be selected on the basis of the address decode signal. At this time, we have found out that the chip area is enlarged if the circuit for feeding the erasing negative voltage and the circuits for the programming and reading voltages are arranged separately of each other. Thus, we have also investigated a circuit of FIG. 11 while being convinced of the utility of feeding the negative voltage by the circuit which is disposed at one end of the word line, as shown in FIG. 11. According to the result of investigations, an inverter INV100 has its MOSFET Q100 turned ON when the input of an inverter INV200 is set to a low level by the erasing operation, so that a word line W1 is fed with the negative voltage Vppn. Simultaneously with this, the inverter INV200 has its MOSFET Q101 turned ON, too. Thus, we have found that the MOSFET Q100 has its gate voltage lowered to have a seriously high ON resistance or that the same MOSFET Q100 is turned OFF so that the normal erasing operation cannot be accomplished.

An object of the present invention is to provide a nonvolatile semiconductor memory device which is equipped with a word driver capable of feeding word lines selectively with voltages necessary not only for the programming and reading operations but also for an erasing operation at the word line unit.

Another object of the present invention is to provide a nonvolatile semiconductor memory device in which only a small area is occupied by the word driver capable of feeding the word lines selectively with the voltages individually necessary for the reading, erasing and programming operations.

Still another object of the present invention is to provide a nonvolatile semiconductor memory device in which only a gate delay is caused by the word driver capable of feeding the word lines selectively with the voltages individually necessary for the reading, erasing and programming operations.

The foregoing and other objects and novel features of the present invention will become apparent from the following description to be made with reference to the accompanying drawings.

The representative ones of the invention to be disclosed herein will be briefly summarized in the following.

Specifically, the nonvolatile semiconductor memory device comprises: a plurality of memory cells of MOS transistor type each having a floating gate, a control gate coupled to a word line, a source coupled to a source line, and a drain coupled to a data line; a word driver for feeding the word lines selectively with first to fourth voltages necessary for electrically erasing, programming and reading the memory cells; and an address decoder for feeding the word driver with a select signal for selecting the word drivers.

Of the above-specified voltages: the second voltage is a voltage (e.g., a Vee voltage at −10 V) having a polarity opposed to the first voltage (e.g., a Vcc voltage at 3.3 V); the fourth voltage is a reference potential (e.g., a Vss voltage at 0 V) of the circuit; and the third voltage is a voltage (e.g., a Vpp voltage at 12 V) having a larger level difference from the fourth voltage than that of the first voltage and the same polarity as that of the first voltage.

The aforementioned word driver is equipped with a logic select circuit and a voltage select circuit.

Of these, the logic select signal switches the select level of the select signal, which is obtained from the output of the address decoder, selectively into a positive or negative logic in dependence upon whether or not the mode is in the erase mode.

The aforementioned voltage select circuit VOLS is equipped, as shown in FIG. 1, with an output circuit which is constructed of a complementary MOS inverter INV2 having its output coupled to the word line. This output circuit has its two inputs coupled to the output of the aforementioned logic select circuit LOGS through different signal paths. To these signal lines, there are coupled feedback MOS transistors Q54 and Q55 for feeding back the output of the output circuit to the inputs of the same.

Those output circuit and feedback MOS transistors are operated by the power voltage Which is shared by first and second terminals. Of these, the first terminal is fed in the program mode with the Vpp voltage and in the erase and read modes with the Vcc voltage, and the second terminal is fed in the erase mode with the Vee voltage and in the program and read mode with the Vss voltage. Thus, the voltage select circuit VOLS constitutes a higher voltage line to be operated by a voltage ranging from the Vee voltage to the Vpp voltage, and the aforementioned signal paths are arranged at their individual initial stages with isolating MOS transistors for preventing the logic select circuit constituting the lower voltage line to be operated by a voltage ranging from the Vss voltage to the Vcc voltage, from being fed with any excessive voltage.

In case a predecode system is adopted as the word line selecting logic, the plurality of voltage select circuits have their inputs commonly connected with the output of one logic select circuit, as shown in FIG. 2, so that they may be selected by predecode signals. At this time, the voltage select circuits have to feed the word lines selectively with the same voltage as that which is not selected in another logic select circuit, even if they are fed with the select level from the logic select circuit but not selected for their operation by the predecode signals. Thus, the aforementioned isolating MOS transistors are switched by the predecode signals. To the aforementioned signal lines, moreover, there are coupled a pair of level forcing MOS transistors such as pull-up MOS transistors and pull-down MOS transistors which are switched complementarily with the aforementioned isolating MOS transistors, when the isolating MOS transistors are cut off, to feed a predetermined voltage to the input of the output circuit so that voltages in the unselected states may be outputted to the word lines.

In order to prevent a phenomenon that the output of the aforementioned select circuits have their levels fluctuated undesirably according to the threshold voltages of the MOS transistors, the aforementioned logic select circuit LOGS may desirably adopt a complementary MOS transfer gate for transmitting the input select signal inverted by a complementary MOS inverter circuit and a complementary MOS transfer gate for transmitting the non-inverted input select signal as it is.

The connection construction of the aforementioned output circuit and the paired feedback MOS transistors can be made of a static latch shape, as shown in FIGS. 7 and 8. The logic select circuit LOGS of this time has its output transmitted to the circuit of the static latch shape having a single end.

According to the means thus far described, in the electrically erasing operation for the aforementioned memory cells, the logic select circuit LOGS feeds the selected level as a negative logic, for example, to the voltage select circuits VOLS. As a result, the word line of the memory cell to be selected for the erasing operation is fed from the second terminal with the Vee voltage which has a polarity different from that of the Vcc voltage to be applied to the source or drain of the memory cell. The word lines of the memory cells unselected for the erasing operation are fed with the Vcc voltage from the first terminal. Although the selected signal as the logic signal to be fed from the logic select signal LOGS has a signal level of the lower voltage line, the output circuit of the voltage select circuits as the higher voltage line is subjected to complete push-pull operations by the actions of the feedback MOS transistors.

In the electrically programming and reading operations for the memory cells, the logic select circuit LOGS feeds the selected level as a positive logic, for example, to the voltage select circuits VOLS. In the electrically programming operation for the aforementioned memory cells, the word line of the memory cell to be selected for the programming operation is fed with the Vpp voltage from the first terminal, and the word lines of the memory cells unselected for the programming operation are fed with the Vss voltage from the second terminal. In the read mode for the memory cell, the Vcc voltage from the first terminal or the Vss voltage from the second terminal is fed depending upon whether or not the reading of data is to be selected.

In the word driver coupled to one of the word lines, the selective feed of the word lines with the voltage necessary for the program and read modes arid for the erase mode at the word line unit makes it unnecessary to construct the word driver and the address decoder separately for the higher and lower voltage lines, so that it can reduce the chip area be occupied by the word driver.

The two paths for transmitting the outputs to the logic select circuit LOGS are individually equipped with the output MOS transistors, the feedback MOS transistors and the isolating MOS transistors having the conduction types different from each other. As a result, it is prevented without fail by the paired isolating MOS transistors of the different conduction types that the second voltage such as the Vee voltage and the third voltage such as the Vpp voltage to be fed to the aforementioned paths through the feedback MOS transistors are transmitted to the logic select circuit LOGS.

The adoption of the complementary MOS transfer gate for selecting the positive and negative logics in the logic select circuit LOGS acts to maximize the signal amplitude of the logic signals to be fed to the voltage select circuits so that it makes a contribution to the speed-up of the operation of the word driver.

BRIEF DESCRIPTION OF THE DRAWINGS

FIG. 3 is an explanatory diagram showing the voltages of operating power supply terminals P1 to P4 of the word driver of FIG. 2 and the voltages of word lines in the individual operation modes of the memory;

FIG. 6 is an explanatory diagram showing bias conditions as voltage conditions necessary for the operations of FIG. 5;

DESCRIPTION OF THE PREFERRED EMBODIMENT

Figure 4:
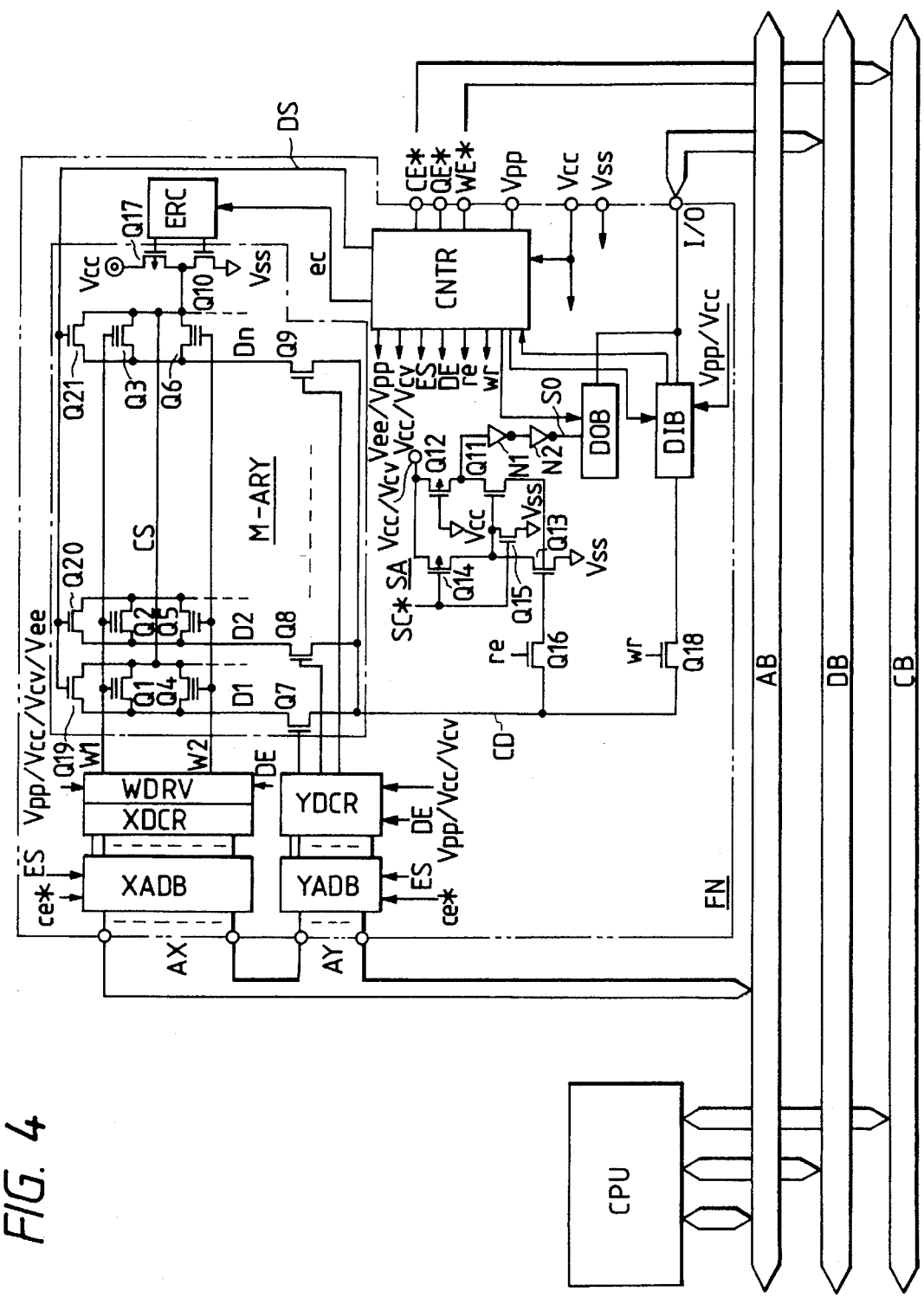
FIG. 4 is a block diagram showing a flash memory according to one embodiment of the present invention.

FIG. 4 is a block diagram showing a flash memory FN according to one embodiment of the present invention. The flash memory, as shown, is formed over a semiconductor substrate of single crystalline silicon by the well-known semiconductor circuit fabricating technology, although not especially limited thereto.

In the flash memory of the present embodiment, internal complementary address signals are created and fed to address decoders XDCR and YDCR by address buffers XADB and YADB which receive an X-address signal AX and a Y-address signal AY fed from the outside through external terminals. Although not especially limitative, the aforementioned address buffers XADB and YADB are activated by an internal chip select signal ce* (the symbol "*" implies that the signal lines designated thereby are those having their levels inverted from signal lines undesignated and that the control signals designated thereby are low active signals) to fetch the external address signals AX and AY at the external terminals from a central processing unit CPU through an address bus AB, thereby to create complementary address signals which are composed of internal address signals in phase with and in opposite phase to the external address signals fed from the external terminals. Moreover, the aforementioned address buffers XADB and YADB are fed with a signal ES indicating an erase mode in addition to the aforementioned chip select signal ce*.

The X-address line address decoder XDCR is activated by an address decoder activate signal DE to create a select signal for selecting one word line according to the complementary address signal coming from the corresponding address buffer XADB, from a plurality of word lines in a memory array M-ARY. The select signal thus created is fed to a word driver WDRV to feed a voltage according to the operation mode to the word lines. The Y-address line address decoder YDCR is also activated by the aforementioned address decoder activate signal DE to create a select signal for selecting one data line according to the complementary address signal coming from the corresponding address buffer YADB, from a plurality of data lines in the memory array M-ARY.

This memory array M-ARY is equipped with a plurality of word lines, a plurality of data lines, which are arranged to intersect the word lines, and a plurality of memory cells which are disposed at the individual intersections between the word lines and the data lines. In FIG. 4, a portion of the memory array M-ARY is shown as a representative example. Specifically, FIG. 4 shows the word lines W1 and W2 of the plurality of word lines, the data lines D1, D2 and Dn of the plurality of data lines, and the memory cells disposed at the intersections between the specified data lines and word lines, by way of example. Each of the memory cells is constructed of one memory transistor (of a non-volatile memory element). Specifically, each memory cell is constructed of a memory transistor having a structure which is equipped with a control gate and a floating gate. The memory cell, as exemplified in FIG. 4, is constructed of memory transmitters (as will also be shortly referred to as "memory cells") Q1 to Q6 acting as non-volatile memory elements.

In the aforementioned memory array M-ARY, the memory cells Q1 to Q3 (or Q4 to Q6) arranged in a common row have their control gates (i.e., select nodes of the memory cells) connected with the corresponding word line W1 (or W2), and the memory cells Q1 and Q4 to Q3 and Q6 arranged on common columns have their drain regions (i.e., input/output nodes of the memory cells) connected with the corresponding word lines D1 to Dn. The aforementioned memory cells have their source regions coupled to a source line CS.

In this embodiment, there are connected with the source line CS an N-channel MOSFET Q10 and a P-channel MOSFET Q17 which are switched by an erase circuit ERC, although not especially limited thereto. This erase circuit ERC turns ON the aforementioned N-channel MOSFET Q10 when in the program mode and in the read mode, to feed the aforementioned source line CS with the earth potential Vss of the circuit. In the erase mode, on the other hand, the aforementioned P-channel MOSFET Q17 is turned ON to feed the aforementioned source line CS with a supply voltage Vcc. The individual program, read and erase modes are set by the data (or command) which is fed from the central processing unit CPU through a data bus DB to a data input buffer DIB.

If, in the aforementioned memory array M-ARY, each block including the plurality of word lines is to be erased in its entirety, the memory cells arranged in a matrix shape are transversely divided into M blocks, each of which is equipped with a source line corresponding to the aforementioned one. As described above, each source line CS disposed in each block is equipped with the erase circuit ERC and the MOSFETs Q10 and Q17, as described above. In this case, each erase circuit has to be designated by the address signal so as to determine which block is to be erased. In the present embodiment, the data stored in the memory cells are erased at the unit of word line, as will be described in detail hereinafter. In this case, the aforementioned erase circuit ERC and MOSFETs Q10 and Q17 are provided to correspond to one source line CS.

In the flash memory of the present embodiment, the programming/reading operations are performed at the unit of a plurality of bits, e.g., 8 bits so that a plurality of sets, e.g., totally eight sets of memory arrays M-ARY are provided, although not especially limited thereto. Incidentally, in case the data are to be programmed or read at the unit of 16 bits, sixteen sets of aforementioned memory arrays M-ARY are provided, for example.

The individual data lines D1 to Dn composing one of the aforementioned memory arrays M-ARY are selectively connected with a common data line CD through column select switch MOSFETs Q7 to Q9 (i.e., column switches) which receive the select signal created by the aforementioned column address decoder YDCR. With the common data line CD, there is connected through a switch MOSFET Q18 the output terminal of the program data input buffer DIB which receives a program data inputted from an external terminal I/O. Likewise, the remaining seven memory arrays, although not shown, are equipped with the column selecting switch MOSFETs similar to the aforementioned ones and are fed with the select signal from the aforementioned column address decoder YDCR. Incidentally, the individual memory arrays may be equipped with different column address decoders so that the column select switch MOSFETs may be switched by the select signals coming from the corresponding column address decoders.

The common data line CD provided to correspond to the aforementioned memory array M-ARY is coupled through a switch MOSFET Q16 to the input terminal of a initial-stage amplifies which constitutes an input-stage circuit of a sense amplifier SA. For conveniences, a circuit, which is composed of MOSFETs Q11 to Q15 constituting the initial-stage amplifier and CMOS inverters N1 and N2 in a tandem form, will be called the "sense amplifier SA". This sense amplifier SA is fed with the Vcc voltage as an operating power when in an ordinary reading operation and with a Vcv voltage having a lower potential than that of the Vcc voltage as a power supply when in an erasure verifying operation. When in a program verifying operation, on the other hand, the sense amplifier SA is fed with a Vcv voltage having a higher potential than that of the Vcc voltage as the power supply.

The common data line CD, as exemplified above, is connected with the source of the N-channel type amplify MOSFET Q11 through the MOSFET Q16 which is turned On by a read control signal re. Between the drain of this amplify MOSFET Q11 and the operation power voltage terminals Vcc/Vcv of the sense amplifier SA, there is connected a P-channel type load MOSFET Q12 which has its gate fed with the Vss voltage such as the ground potential of the circuit. The load MOSFET Q12 operates to feed a precharge current to the common data line CD for the reading operation.

In order to enhance the sensitivity of the aforementioned amplify MOSFET Q11, the voltage of the common data line CD through the switch MOSFET Q16 is fed to the gate of the drive MOSFET Q13 or the input of an inverting amplifier which is composed of the N-channel type drive MOSFET Q13 and the P-channel type load MOSFET Q14. This inverting amplifier has its output voltage fed to the gate of the aforementioned amplify MOSFET Q11. In order to prevent the sense amplifier SA from consuming a wasteful current during an inoperative time period, there is connected between the aforementioned amplify MOSFET Q11 and the ground potential Vss of the gate circuit the N-channel MOSFET Q15. This MOSFET Q15 and the aforementioned P-channel MOSFET Q14 have their gates fed commonly with an operation timing signal sc* of the sense amplifier.

At the reading time of the memory cells, the operation timing signal sc* of the sense amplifier is set to the low level. As a result, the MOSFET Q14 is turned ON whereas the MOSFET Q15 is turned OFF. The memory cells composing the memory array are fed, according to the data programmed in advance, with a higher or lower threshold voltage than the select level of the word lines in the reading operation.

In the reading operation, the aforementioned timing signal sc* is set to the low level so that the common data line CD can be fed with the current through the MOSFETs Q12, Q11 and Q16. In case, at this time, one selected from the plurality of memory cells composing the memory array M-ARY is turned OFF by the aforementioned individual address decoders XDCR and YDCR despite of the fact that the word lines are at the select level, the common data line CD is not connected with the ground potential Vss through the MOSFET Q10 so that it is given the high level which is limited to a lower potential than the power voltage Vcc by the currents fed from the MOSFETs Q12 and Q11. In case, on the other hand, the aforementioned selected memory cell is turned ON by the select level of the word lines, the common data line CD is connected with the ground potential Vss through the MOSFET Q10 so that it is given the low level which is limited to a higher potential than the ground potential Vss. In short, the common data line CD has its high level limited to a lower potential than the power voltage Vcc, as described above, because the output voltage at the lower level, which is generated by the inverting amplifier (i.e., the MOSFETs Q13 and Q14) made receptive of the potential at that high level, is fed to the gate of the MOSFET Q11. On the other hand, the common data line CD has its low level limited to a higher potential than the ground potential Vss, as described above, because the voltage at the higher level, which is generated by the inverting amplifier (i.e., the MOSFETs Q13 and Q14) made receptive of the potential at that low level, is fed to the gate of the MOSFET Q11. Data line discharge MOSFETs Q19 to Q21 are connected between the individual data lines D1 to Dn and the source line, to discharge the charge of the data lines, which are not selected by the column address dress decoder YDCR, i.e., the charge of the unselected data lines to the source line CS in response to a signal DS fed to the gates thereof.

The aforementioned amplify MOSFET Q11 amplifies the input of its gate grounded type source and transmits its output signal to the input of the CMOS inverter N1. The CMOS inverter N2 creates the signal SO, which is prepared by shaping the waveform of the output signal of the aforementioned CMOS inverter N1, to transmit it to the input of a data output buffer DOB. This data output buffer DOB amplifies the aforementioned signal SO and sends out it from the external terminal I/O. Moreover, the program data to be fed from the aforementioned external input/output terminal I/O is transmitted through the data input buffer DIB to the aforementioned common data line CD.

Letters CNTR appearing in FIG. 4 designate a control circuit which receives the external control signals and a Vpp voltage for feeding internal circuits with the aforementioned various internal control signals and various voltages according to the programming, erasing and reading operations instructed by said external control signals. These external control signals are fed from the central processing unit CPU through a control bus CB. The external control signals to be fed to the control circuit CNTR are exemplified, although not especially limitative, a chip enable signal CE* for instruction a chip selection, an output enable signal OE* for instructing a data output such as the reading operation, a program enable signal for instructing a data fetch such as the programming direction, and control data to be fed from the outside through the data input buffer DIB. These control data include those to be used for instructing the erasing operation of the flash memory. The powers to be supplied to the flash memory of the present embodiment are exemplified by the Vpp voltage power, the Vcc voltage power and the Vss voltage power. Of these: the Vss voltage power is a reference potential of the circuit; the Vcc voltage power is the voltage of a positive electrode having a predetermined potential difference from the Vss voltage power; and the Vpp voltage power is that voltage of the same polarity as that of the Vcc voltage power, which has a higher potential difference from the reference potential of the circuit than the aforementioned predetermined potential difference.

Figure 5:
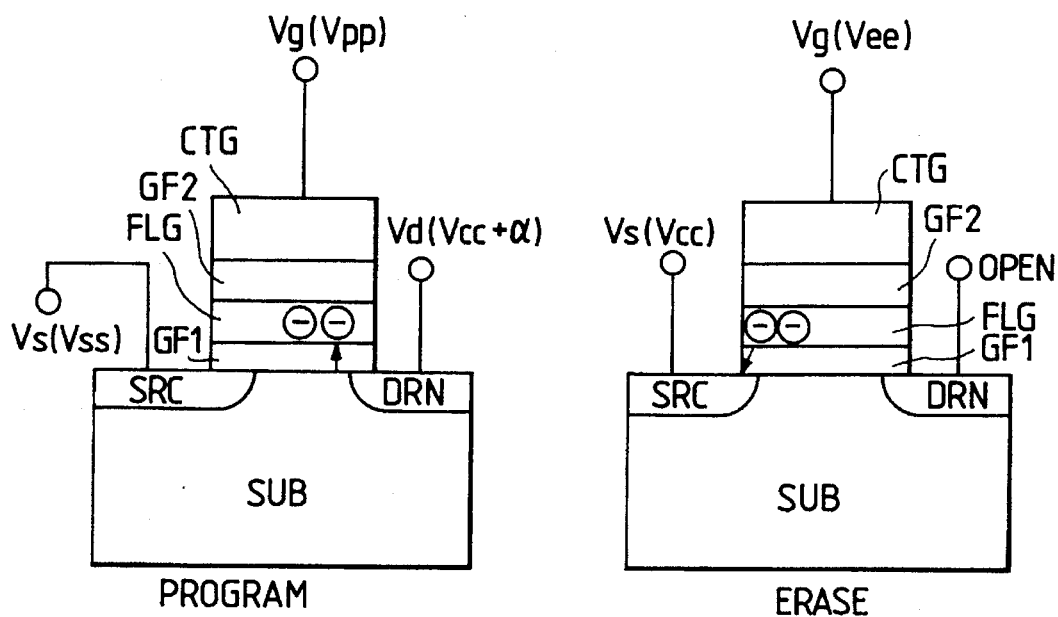
FIG. 5 is an explanatory diagram showing a device section structure of memory cells in the flash memory, and the bias voltages of the programming, erasing and reading operations.
Figure 5:
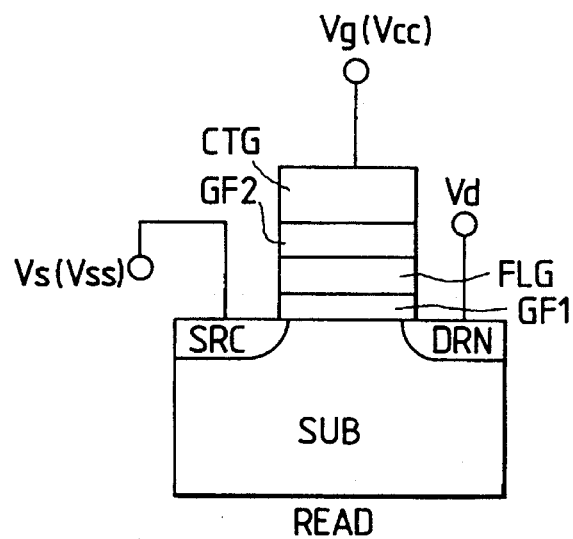

FIG. 5 presents a device section structure of the memory cells in the flash memory and the bias voltages of the programming, erasing and reading operations. FIG. 6 presents bias conditions as the voltage conditions of those operations.

Each memory cell is so constructed, although not especially limitative, into an insulated gate type field effect transistor having a two-layered gate structure formed over a substrate region such as a P-type silicon substrate or a P-type well region, as to include: a floating gate FLG formed over a gate insulating film GF1; a control gate CTG formed over the floating gate FLG through an inter-layer insulating film GF2; and a source SRC and a drain DRN formed separately of each other in the aforementioned substrate region and overlapping the floating gate FLG across the aforementioned gate insulating film GF1.

The programming of the memory cell is performed by establishing hot electrons in the vicinity of the drain DRN to implant the floating gate FLG with the hot electrons. As shown in FIG. 5, for example: the control gate CTG of the memory cell selected for the programming operation has its voltage Vg set to the Vpp voltage (e.g., 12 V); the drain DRN has its voltage Vd set to (Vcc +) (e.g., V); and the source SRC and the substrate region SUB have their voltage V set to the Vss voltage (e.g., 0 V). The aforementioned voltage (Vcc +) is created by dropping the Vpp voltage, although not especially limited thereto.

The erasure of the memory cell is performed by extracting the electrons from the floating gate FLG to the source SRC by a tunnel current. For example: the source SRC of the memory cell selected for the erasure has its voltage Vs set to the Vcc Voltage (e.g., 3.3 V); the drain DRN is opened (to the floating state); the control gate CTG has its voltage Vg set to the Vee voltage (e.g., −10 V); and the substrate region SUB is set to the Vss voltage (e.g., 0 V). The control gate of the memory cell thus made into an erasure couple is fed with a negative voltage such as the Vee voltage.

The control gate CTG of the memory cell selected for the reading operation has its voltage Vg set to the Vcc voltage (e.g., 3.3 V), and the drain DRN has its voltage Vd set to the voltage (Vcc −) (e.g., 1 V) which is lowered from the Vcc voltage. The channel current does not flow, if a negative charge is stored in the floating gate FLG, but flows if not. The former situation corresponds to the data "0" whereas the latter situation corresponds to the data "1", for example. By the programming operation, the memory cell has its threshold voltage set to a higher level with respect to its control gate CTG than that of the memory cell which is not programmed but set in the erased state. In either the programmed or erased state, the memory transistor has its threshold value set to a positive voltage level. In short, the threshold voltage is set to a higher level when in the programmed state and to a lower level when in the erased state than the word line selecting level which is fed from the word line to the control gate CTG. Thanks to such relation between those two threshold voltages and the word line selecting level, the memory cell can be made of one transistor without adopting any select transistor.

According to the present embodiment, the abovespecified individual voltages are created and selectively fed by the aforementioned control circuit CNTR in accordance with the operation modes which are instructed by the external control signals CE*, OE* and WE* and the control data fed through the data input buffer DIB.

Figure 1:
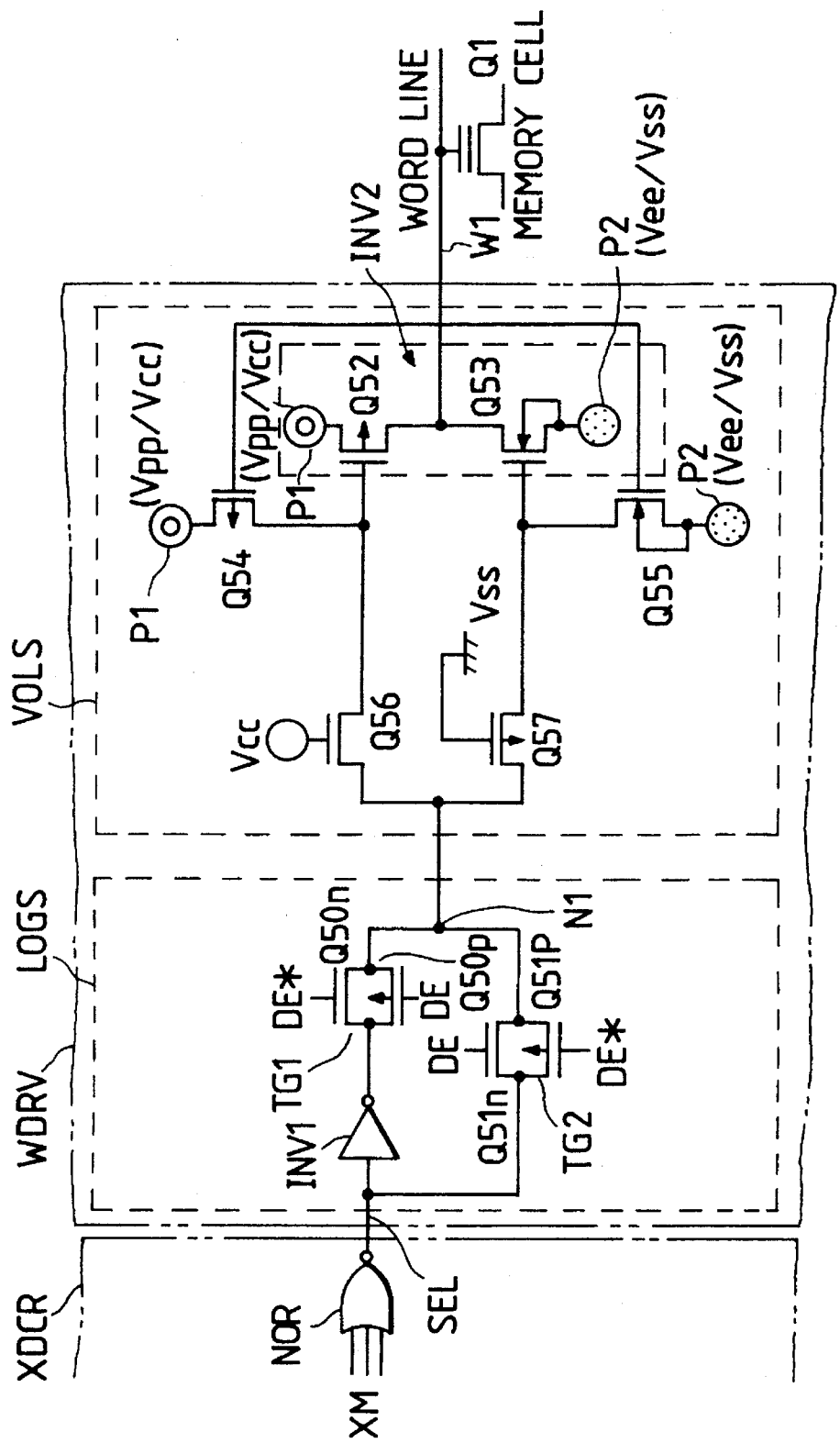
FIG. 1 is a circuit diagram showing one example of a word driver to be applied to a flash memory according to one embodiment of the present invention.

FIG. 1 is a circuit diagram showing one example of the word driver WDRV represented by a structure for one word line.

The word driver WDRV selects the voltages necessary for the electric erasing, programming and reading operations of the memory cells and feed them to the word lines. In the address decoder XDCR for feeding the selected signals of the word lines to that word driver WDRV, a three-input NOR circuit (i.e., a negative OR circuit) NOR is representatively shown in FIG. 1. A signal XM to be fed to the NOR circuit NOR is a circuit of three bits, which is prepared from a predetermined bit of the internal address signal or by transmitting a predetermined bit of the internal address signal through a not-shown logic gate, and which is deemed as a signal for instructing which of eight word lines of one set is to be selected. The output of this NOR circuit NOR is used as a select signal SEL for the corresponding word line. According to the present embodiment, the select signal SEL has its high level used as the select level.

The voltage to be selectively fed to the word lines by the aforementioned word driver WDRV is exemplified by the Vcc voltage at 3.3 V, the Vee voltage at −10 V, the Vss voltage at 0 V as the circuit ground potential or the reference potential, and the Vpp voltage at 12 V. Although the voltage to be fed at the verifying time is not especially described in the description of the word driver of the present embodiment, the voltage to be fed to the word lines can be easily understood if the Vcc voltage at the reading time in the following description is replaced by the Vcv voltage, because the verifying operation is substantially identical to the reading operation. The word driver WDRV to be described in the following is equipped with a logic select circuit LOGS and a voltage select circuit VOLS.

The logic select circuit LOGS switches the select level of the select signal SEL, which is obtained from the output of the address decoder XDCR, selectively into the positive or negative logic in dependence upon whether or not the operation is the erasing operation. For example, the logic select circuit LOGS is constructed to include: a CMOS (i.e., complementary MOS) inverter INV1 for inverting the select signals SEL; a CMOS transfer gate TG1 composed of an N-channel MOSFET Q50n and a P-channel type MOSFET Q50p for transmitting the output of the CMOS inverter INV1 and the select signal SEL selectively to the common output node N1; and a CMOS transfer gate TG2 composed of an N-channel type MOSFET Q51n and a P-channel type MOSFET Q51p. Of these, the MOSFETs Q50n and Q51p have their gates fed with a control signal DE* whereas the MOSFETs Q50p and Q51n have their gates fed with the control signal DE. When the erasing operation is instructed, the control signal DE is set to the high level whereas the control signal DE* is set to the low level so that the select signal SEL is outputted in the non-inverted state from the node N1. When the programming and reading operations are instructed, the control is inverted so that the select signal SEL is inverted and outputted to the node N1. The logic select signal LOGS thus constructed uses the Vcc voltage and the Vss voltage as its operating power.

The aforementioned voltage select circuit is constructed to include an output circuit INV2 of a complementary MOS inverter composed of a P-channel type MOSFET Q52 and an N-channel type MOSFET Q53, which have their outputs coupled to the word line W1. The gates of the MOSFETs Q52 and Q53 composing said output circuit INV2 are coupled through individual different paths to the output node N1 of the aforementioned logic select circuit LOGS. To the gates of the aforementioned MOSFETs Q52 and Q53, there are coupled a P- channel type feedback MOSFET Q54 and an N-channel type feedback MOSFET Q55 for feeding back the output of the output circuit INV2 positively to the input. These output circuit INV2 and feedback MOSFETs Q54 and Q55 are operated by the voltages which are fed to a first terminal P1 and a second terminal P2. Of these, the first terminal P1 is fed with the Vpp voltage when in the programming operation and with the Vcc voltage when in the erasing and reading operations, whereas the second terminal P2 is fed with the Vee voltage when in the erasing operation and with the Vss voltage when in the programming and reading operations. As a result, the voltage select circuit VOLS is a higher voltage type, in which the range from the Vee voltage (of −10 V) to the Vpp voltage (of 12 V) is used as the operating voltage. In order to prevent an excessive voltage from being fed to the logic select circuit LOGS constituting the lower voltage line in which the range from the Vss (of 0 V) to the Vcc voltage (of 3.3 V) is used as the operating voltage, an N-channel type isolating MOSFET Q56 having its gate coupled to the Vcc voltage is arranged between the drain of the MOSFET Q54 and the node N1, and a P-channel type isolating MOSFET Q57 having its gate coupled to the Vss voltage is arranged between the drain of the MOSFET Q55 and the node N1. Incidentally, since the aforementioned N-channel type MOSFETs Q53 and Q55 are fed with a negative voltage such as the Vee voltage, a double well structure adopting the P-type well region for the negative voltage is used to prevent the leak age current to the substrate. For example, the P-type well region is formed in the P-type semiconductor substrate through an N-type region and is formed with those N-channel type MOSFETs. When the terminal P2 is fed with the Vee voltage, the aforementioned P-type well region is biased to the Vee voltage.

The voltage to be fed to those terminals P1 and P2 controls the aforementioned control circuit CNTR in accordance with the operation modes which are instructed by the external control signals CE*, OE* and WE* and the control data (or commands) inputted to the data input buffer DIB.

Here will be described the operations of the word driver WDRV of FIG. 1.

(1) Program Mode

When all the external control signals CE*, OE* and WE* are in a predetermined state (e.g., at the low level), there is established the program mode for instructing the programming operation of the flash memory FN, if the data inputted to the data input buffer DIB is a command indicating the data programming operation. When the programming operation is instructed, the terminal P1 is fed with the Vpp voltage whereas the terminal P2 is fed with the Vss voltage from the control circuit CNTR. In this particular operation, moreover, the control signal DE is controlled to the low level whereas the control signal DE* is controlled to the high level. When the memory cell Q1 is a memory cell to be programmed with the data, the signal XM of 3 bits to be fed from the address decoder XDCR is wholly set to the low level, and the select signal SEL is set to the select level (i.e., the high level). Then, the node N1 is set to the low level through the CMOS transfer gate TG1, and this low level is fed to the individual gates of the MOSFETs Q52 and Q53. As a result, the MOSFET Q52 of the output circuit INV2 is turned ON to start the charging of the word line W1 with the Vpp voltage of the terminal P1. At this time, the low level to be fed to the gate of the other MOSFET Q53 is set to a higher low level than the initial Vss voltage by the action of the MOSFET Q57 so that the MOSFET Q53 is not completely cut off whereas the conductance of the feedback MOSFET Q55 is increased with the rise of the level of the word line W1. As a result, the MOSFET Q53 has its gate forced to the Vss voltage so that it is completely cut off. Thus, the word line to be coupled to the memory cell to be selected in the data programming operation is charged to the Vpp voltage.

When the memory cell Q1 is not selected for the programming operation, at least one bit of the aforementioned signal of 3 bits is set to the high level so that the select signal SEL is set to the unselect level(i.e., the low level). As a result, the signal to be fed through the CMOS transfer gate TG1 to the node N1 is set to the high level and is fed to the gate of each of the MOSFETs Q52 and Q53. As a result, the MOSFET Q53 of the output circuit INV2 is turned ON to start the discharging of the word line W1 to the Vss voltage through the terminal P2. At this time, the high level to be fed to the gate of the other MOSFET Q52 is set to a lower level, which is lowered by the threshold voltage of the MOSFET Q56, than the Vcc voltage. Since the source of the MOSFET Q52 is at the Vpp voltage, moreover, the MOSFET Q52 is not completely cut off. As the level of the word line W1 is lowered by the MOSFET Q53, however, the conductance of the feedback MOSFET Q54 is increased so that the MOSFET Q52 has its gate forced by the Vpp voltage into a completely cut-off state. As a result, the word line unselected for the programming operation is discharged to the Vss voltage.

The aforementioned isolating MOSFET Q56 prevents the Vpp voltage, which is fed through the feedback MOSFET Q54 when the programming operation is not selected, from being fed to the node N1.

(2) Read Mode

When all the external control signals CE*, OE* and WE* are in a predetermined state (e.g., at the low level), there is established the read mode for instructing the reading operation of the flash memory FN, if the data inputted to the data input buffer DIB is a command indicating the data reading operation. When the reading operation is instructed, the terminal P1 is fed with the Vcc voltage whereas the terminal P2 is fed with the Vss voltage from the control circuit CNTR. In this particular operation, moreover, the control signal DE is controlled to the low level whereas the control signal DE* is controlled to the high level. When the memory cell Q1 is a memory cell to be selected, the signal XM of 3 bits to be fed from the address decoder XDCR is wholly set to the low level, and the select signal SEL is set to the select level (i.e., the high level). Then, the node N1 is set to the low level through the CMOS transfer gate TG1, and this low level is fed to the individual gates of the MOSFETs Q52 and Q53. As a result, the MOSFET Q52 of the output circuit INV2 is turned ON to start the charging of the word line W1 with the Vcc voltage of the terminal P1. At this time, the low level to be fed to the gate of the other MOSFET Q53 is set to a higher low level than the initial Vss voltage by the action of the MOSFET Q57 so that the MOSFET Q53 is not completely cut off whereas the conductance of the feedback MOSFET Q55 is increased with the rise of the level of the word line W1. As a result, the MOSFET Q53 has its gate forced to the Vss voltage so that it is completely cut off. Thus, the word line to be coupled to the memory cell to be selected in the data reading operation is charged to the Vcc voltage.

When the memory cell Q1 is not selected for the reading operation, at least one bit of the aforementioned signal of 3 bits is set to the high level so that the select signal SEL is set to the unselect level (i.e., the low level). As a result, the signal to be fed through the CMOS transfer gate TG1 to the node N1 is set to the high level and is fed to the gate of each of the MOSFETs Q52 and Q53. As a result, the MOSFET Q53 of the output circuit INV2 is turned ON to start the discharging of the word line W1 to the Vss voltage through the terminal P2. At this time, the high level to be fed to the gate of the other MOSFET Q52 is set to a lower level, which is lowered by the threshold voltage of the MOSFET Q56, than the Vcc voltage. As a result, the MOSFET Q52 is not completely cut off. As the level of the word line W1 is lowered by the MOSFET Q53, however, the conductance of the feedback MOSFET Q54 is increased so that the MOSFET Q52 has its gate forced by the Vcc voltage into a completely cut-off state. As a result, the word line unselected for the reading operation is discharged to the Vss voltage.

(3) Erase Mode

When all the external control signals CE*, OE* and WE* are in a predetermined state (e.g., at the low level), there is established the erase mode for instructing the erasing operation of the flash memory FN, if the data inputted to the data input buffer DIB is a command indicating the data erasing operation. When the erasing operation is instructed, the terminal P1 is fed with the Vcc voltage whereas the terminal P2 is fed with the Vee voltage from the control circuit CNTR. In this particular operation, moreover, the control signal DE is controlled to the low level whereas the control signal DE* is controlled to the high level so that the logic of the node N1 with respect to the select signal SEL is inverted from that of the programming and reading operations. When the memory cell coupled to the word line is a memory cell to be selected for the erasing operation, the signal XM of 3 bits to be fed from the address decoder XDCR is wholly set to the low level, and the select signal SEL is set to the select level (i.e., the high level). Then, the node N1 is set to the high level through the CMOS transfer gate TG2, and this low level is fed to the individual gates of the MOSFETs Q52 and Q53. As a result, the MOSFET Q53 of the output circuit INV2 is turned ON to start the charging of the word line W1 with the Vee voltage of the terminal P2. At this time, the high level to be fed to the gate of the other MOSFET Q52 is set to a lower level, which is lowered by the threshold voltage of the MOSFET Q56, lower than the Vcc voltage so that the MOSFET Q52 is not completely cut off whereas the conductance of the feedback MOSFET Q54 is increased as the level of the word line W1 is lowered by the MOSFET Q53. As a result, the MOSFET Q52 has its gate forced to the Vcc voltage so that it is completely cut off. Thus, the word line to be coupled to the memory cell to be selected in the erasing operation is set to the Vee voltage.

When the memory cell coupled to the word line W1 is not selected for the erasing operation, at least one bit of the aforementioned signal of 3 bits is set to the high level so that the select signal SEL is set to the unselect level (i.e., the low level). As a result, the signal to be fed through the CMOS transfer gate TG2 to the node N1 is set to the low level and is fed to the gate of each of the MOSFETs Q52 and Q53. As a result, the MOSFET Q52 of the output circuit INV2 is turned ON to start the charging of the word line W1 to the Vcc voltage through the terminal P1. At this time, the low level to be fed to the gate of the other MOSFET Q53 is set to a higher level, which is raised by the action of the MOSFET Q57, than the Vss voltage. Since the source of the MOSFET Q53 is at the Vee voltage, moreover, the MOSFET Q53 is not completely cut off. As the level of the word line W1 is raised by the MOSFET Q52, however, the conductance of the feedback MOSFET Q55 is increased so that the MOSFET Q53 has its gate forced by the Vee voltage into a completely cut-off state. As a result, the word line unselected for the erasing operation is discharged to the Vcc voltage.

The aforementioned isolating MOSFET Q57 prevents the Vee voltage, which is fed through the feedback MOSFET Q55 when the erasing operation is not selected, from being fed to the node N1.

(1) According to the construction of the word driver WDRV of FIG. 1, the voltage necessary for the programming and reading operations and for the erasing operation at the unit of word line can be selectively fed to the word lines by the word driver coupled to one of the word lines. As a result, the word drivers and the address decoders need not be constructed separately for the higher voltage line and the lower voltage line so that the chip area to be occupied by the word driver can be reduced.

(2) As shown in FIG. 1, the two paths for transmitting the output of the logic select circuit LOGS are individually equipped in a symmetric manner with the output MOS transistors Q52 and Q53 of different conduction types, the feedback MOS transistors Q54 and Q55, and the isolating MOS transistors Q56 and Q57. As a result, the negative voltage such as the Vee voltage and the high voltage such as the Vpp voltage to be fed to the aforementioned paths through the feedback MOS transistors Q56 and Q57 can be prevented without fail from being transmitted to the logic select circuit LOGS by the paired isolating MOS transistors Q56 and Q57 of different conduction types. Since, moreover, the voltage select circuit VOLS is symmetrically constructed of the two transmission paths, the aforementioned effect can be realized by a reduced number of circuit elements.

(3) Thanks to the above-specified effects, the circuit elements for selecting the positive logic and the negative logic for the output of the logic select circuit LOGS need not bear the voltage isolating function so that the CMOS transfer gates TG1 and TG2 can be adopted as said circuit elements. As a result, the amplitude of the logic signals to be outputted from the logic select circuit LOGS can be maximized for the operating power voltage to make a contribution to the speed-up of the operation of the word driver WDRV.

Figure 2:
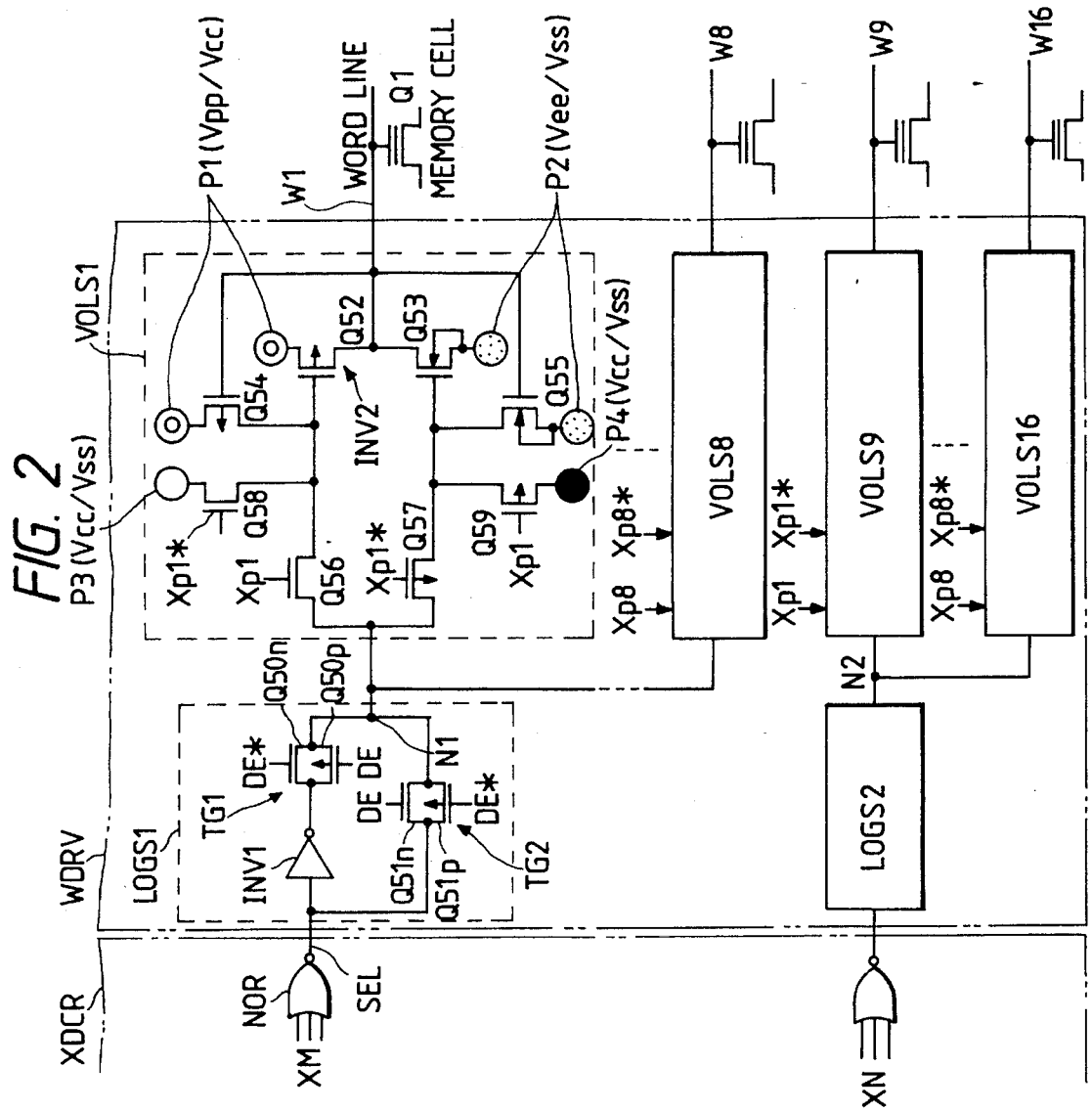
FIG. 2 is a circuit diagram showing another word driver to be applied in case a word line predecode system is adopted.

FIG. 2 is another circuit diagram showing of the word driver WDRV. The construction, as shown, corresponds to the case in which a word line predecode system is adopted. Eight voltage select circuits VOLS1 to VOLS8 have their inputs connected commonly with the output node N1 of a logic select circuit LOGS1, and eight voltage select circuits VOLS9 to VOLS16 have their inputs connected commonly with the output node N2 of a logic select circuit LOGS2, so that the individual voltage select circuits may be selected according to predecode signals Xp1 and Xp1* to Xp8 and Xp8*. The signals XM and XN and the predecode signals Xp1 and Xp1* to Xp8 and Xp8* are fed from the address decoder XDCR. At this time, each of voltage select circuits VOLS1 to VOLS16 has to select the same voltage as those unselected by other logic select circuits, unless the operations are selected by the predecode signals even if the corresponding logic select circuit LOGS1 or LOGS2 outputs the select signal at the select level, and to feed the selected voltage to the word lines. For this necessity, the aforementioned isolating MOSFETs Q56 and Q57 are switched by the predecode signals. Moreover, in order to output the unselected voltage to the word lines when said isolating MOSFETs Q56 and Q57 are cut off, there are added a pull-up MOSFET Q58 and a pull-down MOSFET Q59, which are switched complementarily to the aforementioned isolating MOSFETs Q56 and Q57 to feed predetermined voltages to the individual inputs of the output circuit INV2. The remaining construction is similar to that of FIG. 1.

The different circuit construction of FIG. 2 from that of FIG. 1 will be described in more detail in the following. In FIG. 2, the aforementioned signal XM can be deemed as a signal of 3 bits for instructing which of the eight word line sets each composed of eight word lines is to be selected. The predecode signals Xp1 and Xp1* to Xp8 and Xp8* can be deemed as complementary signals for instructing which of the word lines contained in each word line set is to be selected. According to the present embodiment, the select signal SEL has its high level set to the select level, whereas the predecode signals Xp1 and Xp1* to Xp8 and Xp8* have their high levels and low levels set to the select level.

The voltages to be selectively fed to the word lines by the aforementioned word driver WDRV are identical to those of FIG. 1 and are exemplified by the Vcc voltage at 3.3 V, the Vee voltage at −10 V, the Vss voltage at 0 V for the circuit ground potential or the reference potential, and the Vpp voltage at 12 V.

The aforementioned logic select circuits LOGS1 and LOGS2 are constructed like those of FIG. 1.

The aforementioned voltage select circuits VOLS1 to VOLS16 are individually constructed in a similar manner. The difference in the construction from that of FIG. 1 resides, as in the voltage select circuit VOLS1 shown as a representative: in that there are added the N-channel type pull-up MOSFET Q58 connected between a terminal P3 and the MOSFET Q52 and switched by the predecode signal Xp1* and the P-channel type pull-down MOSFET Q59 connected between a terminal P4 and the MOSFET Q53 and switched by the predecode signal Xp1; and in that the isolating MOSFET Q56 is switched by the predecode signal Xp1 whereas the other isolating MOSFET Q57 is switched by the predecode signal Xp1*. The aforementioned third terminals P3 and P4 are fed with the Vss voltage in the erasing operation and with the Vcc voltage in the programming and reading operations. The voltages to be fed to the aforementioned terminals P3 and P4 are selected by the aforementioned control circuit CNTR in accordance with the operation mode which is instructed by the external control signals CE*, OE* and WE* and the control data coming from the data input buffer DIB.

The operations of the word driver WDRV1 of FIG. 2 will be representatively described in the following. FIG. 3 exemplifies the voltages at the terminals P1 to P4 in the various operation modes and the voltages of the word lines. The manners to set the individual modes of the programming, reading and erasing operations will not be described because they are similar to those described with reference to FIG. 1.

(1) Program Mode

When the programming operation is instructed, the terminal P1 is fed with the Vpp voltage, the terminal P2 is fed with the Vss voltage, and the terminals P3 and P4 are fed with the Vcc voltage all from the control circuit CNTR. In the operation under consideration, the control signal DE is controlled to the low level, and the control signal DE* is controlled to the high level. By setting all the bits of the signal XM to the low level, any of the word lines W1 to W8 can be selected.

Thus, the select signal SEL at the select level (or the high level) is fed through the CMOS transfer gate TG1 to lower the node N1 to the low level, which is fed to the inputs of the individual voltage select circuits VOLS1 to VOLS8. When the memory cell to be programmed is that of the word line W1, only the signals Xp1 and Xp1* of the predecode signals Xp1 and Xp1* to Xp8 and Xp8* are set to the high level and the low level, whereas the remaining ones are set to the low level and the high level. As a result, the isolating MOSFETs Q56 and Q57 are turned ON only for the voltage select circuit VOLS1 so that the signal of the node N1 is fetched only by the voltage select circuit VOLS1. At this time, both the pull-up MOSFET Q58 and the pull-down MOSFET Q59 of the voltage select circuit VOLS1 are cut off. As a result, the MOSFETs Q52 and Q53 of said voltage select circuit VOLS1 have their gates fed with the signal of the aforementioned node N1. As a result, the MOSFET Q52 of the output circuit INV2 is turned ON to start the charging operation of the word line W1 by the Vpp voltage of the terminal P1. At this time, the low level to be fed to the gate of the other MOSFET Q53 is raised at first by a higher low level than the Vss voltage so that the MOSFET Q53 is not completely cut off. In accordance with the rise of the level of the word line W1, the conductance of the feedback MOSFET Q55 is increased so that the MOSFET Q53 has its gate forced to the Vss voltage and is completely cut off. As a result, the word line W1, to which is coupled the memory cell selected in the programming operation, is charged to the Vpp voltage.

If the memory cell Q1 of the word line W1 is not selected for the programming operation in case the select signal SEL is at the high level, as described above, the predecode signals Xp1 and Xp1* are set to the low level and the high level, and both the isolating MOSFETs Q56 and Q57 of the voltage select circuit VOLS1 are turned OFF so that the signal of the node N1 is not fetched by the voltage select circuit VOLS1. At this time, both the pull-up MOSFET Q58 and the pull-down MOSFET Q59 of the voltage select circuit VOLS1 are turned ON. As a result, the MOSFETs Q52 and Q53 of said voltage select circuit VOLS1 have their gates fed with the Vcc voltage or its near high level from the terminals P3 and P4 through the MOSFETs Q58 and Q59 so that the MOSFET Q53 of the output circuit INV2 is turned ON to start the charging operation of the word line W1 to the Vss voltage through the terminal P2. At this time, the high level to be fed to the gate of the other MOSFET Q52 is set to such a level lower than the Vcc voltage as is lowered by the threshold voltage of the MOSFET Q58. Since, moreover, the MOSFET Q52 has its source set to the Vpp voltage, so that it is not completely cut off. As the word line W1 has its level lowered by the MOSFET Q53, however, said MOSFET Q52 has its gate forced to the Vpp voltage so that it is completely cut off. As a result, the word line unselected for the programming operation is discharged to the Vss voltage. The isolating MOSFET Q56 prevents the Vpp voltage, which is to be fed through the feedback MOSFET Q54 when the programming operation is not selected, from being fed to the node N1. At this time, any of the word lines W2 to W8 can be selectively charged to the Vpp voltage by setting any of the predecode signals Xp2 and Xp2* to Xp8 and Xp8* to the high level and the low level.

In order to select a word line W9, on the other hand, all the bits of the signal XN are set to the low level, and the predecode signals Xp1 and Xp1* are set to the high level and the low level. At this time, the word lines W1 to W8 are not selected, at least one bit of the signal XM is set to the high level whereas the select signal SEL is set to the unselect level (i.e., the low level). The signal to be fed to the node N1 through the CMOS transfer gate TG1 is set to the high level and fed to the inputs of the individual voltage select circuits VOLS1 to VOLS8. Here, the predecode signals Xp1 and Xp1* are set to the high level and the low level so as to select the word line W9 so that the corresponding isolating MOSFETs Q56 and Q57 of the voltage select circuit VOLS1 are turned ON. In the voltage select circuit VOLS1 having the isolating MOSFETs Q56 and Q57 turned ON, the high level of the node N1 is fed to the gates of the individual MOSFETs Q52 and Q53. As a result, the MOSFET Q53 of the output circuit INV2 is turned ON to start the charging operation of the word line W1 to the Vss voltage through the terminal P2. At this time, the high level to be fed to the gate of the other MOSFET Q52 is set to such a level lower than the Vcc voltage as is lowered by the threshold voltage of the MOSFET Q56. Since, moreover, the MOSFET Q52 has its source set to the Vpp voltage, it is not completely cut off. As the word line has its level lowered by the MOSFET Q53, however, said MOSFET Q52 has its gate forced to the Vpp voltage so that it is completely cut off. As a result, the word line thus unselected for the programming operation is discharged to the Vss voltage. At this time, the Vpp voltage to be fed through the feedback MOSFET Q54 is prevented from being fed to the node N1 by the isolating MOSFET Q56. The operations of the seven voltage select circuits for turning OFF the aforementioned MOSFETs Q56 and Q57 are similar to those of the case in which the isolating MOSFETs Q56 and Q57 are turned OFF when the select signal SEL is set to the select level.

(2) Read Mode

When the reading operation is instructed, the terminals P1 and P3 are fed with the Vcc voltage whereas the terminals P2 and P4 are fed with the Vss voltage by the control circuit CNTR. In this operation, moreover, the control signal DE is controlled to the low level whereas the control signal DE* is controlled to the high level.

When the memory cell to be read is the memory cell of the word line W1, all the bits of the signal XM assigned to the word lines W1 to W8 are set to the low level. When the select signal SEL is set to the select level (or the high level), the node N1 is set to the low level through the CMOS transfer gate TG1, and this low level is fed to the inputs of the individual voltage select circuits VOLS1 to VOLS8. Of the predecode signals Xp1 and Xp1* to Xp8 and Xp8*, only the signals Xp1 and Xp1* are set to the high level and the low level, whereas the remaining ones are set to the low level and the high level. As a result, the isolating MOSFETs Q56 and Q57 are turned ON only for the voltage select circuit VOLS1 so that the signal of the node N1 is fetched only by the voltage select circuit VOLS1. At this time, both the pull-up MOSFET Q58 and the pull-down MOSFET Q59 of the voltage select circuit VOLS1 are cut off. As a result, the MOSFETs Q52 and Q53 of said voltage select circuit VOLS1 have their gates fed with the signal of the aforementioned node N1. As a result, the MOSFET Q52 of the output circuit INV2 is turned ON to start the charging operation of the word line W1 by the Vcc voltage of the terminal P1. At this time, the low level to be fed to the gate of the other MOSFET Q53 is raised at first by a higher low level than the Vss voltage so that the MOSFET Q53 is not completely cut off. In accordance with the rise of the level of the word line W1, the conductance of the feedback MOSFET Q55 is increased so that the MOSFET Q53 has its gate forced to the Vss voltage and is completely cut off. As a result, the word line, for which is selected the reading operation, is charged to the Vcc voltage.

If the memory cell Q1 of the word line W1 is not selected for the programming operation in case the select signal SEL is at the high level, as described above, the predecode signals Xp1 and Xp1* are set to the low level and the high level, and both the isolating MOSFETs Q56 and Q57 of the voltage select circuit VOLS1 are turned OFF so that the signal of the node N1 is not fetched by the voltage select circuit VOLS1. At this time, both the pull-up MOSFET Q58 and the pull-down MOSFET Q59 of the voltage select circuit VOLS1 are turned ON. As a result, the MOSFETs Q52 and Q53 of said voltage select circuit VOLS1 have their gates fed with the Vcc voltage or its near high level from the terminals P3 and P4 through the MOSFETs Q58 and Q59 so that the MOSFET Q53 of the output circuit INV2 is turned ON to start the charging operation of the word line W1 to the Vss voltage through the terminal P2. At this time, the high level to be fed to the gate of the other MOSFET Q52 is set to such a level lower than the Vcc voltage as is lowered by the threshold voltage of the MOSFET Q58. As a result, the MOSFET Q52 is not completely cut off. As the word line W1 has its level lowered by the MOSFET Q53, however, said MOSFET Q52 has its gate forced to the Vcc voltage so that it is completely cut off. As a result, the word line unselected for the programming operation is discharged to the Vss voltage. At this time, any of the word lines W2 to W8 can be selectively charged to the Vcc voltage by setting any of the predecode signals Xp2 and Xp2* to Xp8 and Xp8* to the high level and the low level.

In order to select the word line W9, on the other hand, all the bits of the signal XN are set to the low level, and the predecode signals Xp1 and Xp1* are set to the high level and the low level. At this time, the word lines W1 to W8 are not selected, at least one bit of the signal XM is set to the high level whereas the select signal SEL is set to the unselect level (i.e., the low level). The signal to be fed to the node N1 through the CMOS transfer gate TG1 is set to the high level and fed to the inputs of the individual voltage select circuits VOLS1 to VOLS8. Here, the predecode signals Xp1 and Xp1* are set to the high level and the low level so as to select the word line W9 so that the corresponding isolating MOSFETs Q56 and Q57 of the voltage select circuit VOLS1 are turned ON. In the voltage select circuit VOLS1 having the isolating MOSFETs Q56 and Q57 turned ON, the high level of the node N1 is fed to the gates of the individual MOSFETs Q52 and Q53. As a result, the MOSFET Q53 of the output circuit INV2 is turned ON to start the charging operation of the word line W1 to the Vss voltage through the terminal P2. At this time, the high level to be fed to the gate of the other MOSFET Q52 is set to such a level lower than the Vcc voltage as is lowered by the threshold voltage of the MOSFET Q56. As a result, the MOSFET Q52 is not completely cut off. As the word line has its level lowered by the MOSFET Q53, however, said MOSFET Q52 has its gate forced to the Vcc voltage so that it is completely cut off. As a result, the word line thus unselected for the reading operation is discharged to the Vss voltage. The operations of the seven voltage select circuits for turning OFF the aforementioned MOSFETs Q56 and Q57 are similar to those of the case in which the isolating MOSFETs Q56 and Q57 are turned OFF when the select signal SEL is set to the select level.

(3) Erase Mode

When the erasing operation is instructed, the terminal P1 is fed with the Vcc voltage, the terminal P2 is fed with the Vee voltage, and the terminals P3 and P4 are fed with the Vss voltage by the control circuit CNTR. In the erasing operation, moreover, the control signals DE and DE* have their levels inverted from the aforementioned ones and controlled to the high level and the low level.

If the memory cell to be erased is the memory cell to be coupled to the word line W1, all the bits of the signal XM assigned to the word lines W1 to W8 are set to the low level. When the select signal SEL is set to the select level (i.e., the high level), the node N1 is set to the high level through the CMOS transfer gate TG2, and this high level is fed to the inputs of the individual voltage select circuits VOLS1 to VOLS8. Of the predecode signals Xp1 and Xp1* to Xp8 and Xp8*, only the signals Xp1 and Xp1* are set to the high level and the low level, whereas the remaining ones are set to the low level and the high level. As a result, the isolating MOSFETs Q56 and Q57 are turned ON only for the voltage select circuit VOLS1 so that the signal of the node N1 is fetched only by the voltage select circuit VOLS1. At this time, both the pull-up MOSFET Q58 and the pull-down MOSFET Q59 of the voltage select circuit VOLS1 are cut off. As a result, the MOSFETs Q52 and Q53 of said voltage select circuit VOLS1 have their gates fed with the signal of the aforementioned node N1. As a result, the MOSFET Q53 of the output circuit INV2 is turned ON to start the feed of the word line W1 with the Vee voltage of the terminal P2. At this time, the high level to be fed to the gate of the other MOSFET Q52 is lowered to a lower level having its level lowered by the threshold voltage of the MOSFET Q56 than the Vcc voltage so that the MOSFET Q52 is not completely cut off. As the level of the word line W1 is lowered by the MOSFET Q53, the conductance of the feedback MOSFET Q54 is increased so that the MOSFET Q52 has its gate forced to the Vcc voltage and is completely cut off. As a result, the word line, which is selected for the erasing operation, is charged to the Vee voltage.

If the word line W1 is not selected for the erasing operation in case the select signal SEL is at the high level, the predecode signals Xp1 and Xp1* are set to the low level and the high level, and both the isolating MOSFETs Q56 and Q57 of the voltage select circuit VOLS1 are turned OFF so that the signal of the node N1 is not fetched by the voltage select circuit VOLS1. At this time, both the pull-up MOSFET Q58 and the pull-down MOSFET Q59 of the voltage select circuit VOLS1 are turned ON. As a result, the MOSFETs Q52 and Q52 of said voltage select circuit VOLS1 have their gates conducted to the Vss voltage of the terminals P3 and P4 through the MOSFETs Q58 and Q59 so that the MOSFET Q52 of the output circuit INV2 is turned ON to start the charging operation of the word line W1 to the Vcc voltage through the terminal P1. At this time, the low level to be fed to the gate of the other MOSFET Q53 is set to a level higher than the Vss voltage by the action of the MOSFET Q59. Since, moreover, the MOSFET Q53 has its source set to the Vee voltage, it is not completely cut off. As the word line W1 has its level raised by the MOSFET Q52, however, the conductance of the feedback MOSFET Q55 is increased. As a result, said MOSFET Q53 has its gate forced to the Vee voltage so that it is completely cut off. As a result, the word line unselected for the erasing operation is set to the Vcc voltage. The isolating MOSFET Q57 prevents the Vee voltage, which is to be fed through the feedback MOSFET Q55 when the erasing operation is not selected, from being fed to the node N1. At this time, any of the word lines W2 to W8 can be selectively charged to the Vee voltage by setting any of the predecode signals Xp2 and Xp2* to Xp8 and Xp8* to the high level and the low level.

In order to select the word line W9, on the other hand, all the bits of the signal XN are set to the low level, and the predecode signals Xp1 and Xp1* are set to the high level and the low level. At this time, the word lines W1 to W8 are not selected, at least one bit of the signal XM is set to the high level whereas the select signal SEL is set to the unselect level (i.e., the low level). The signal to be fed to the node N1 through the CMOS transfer gate TG2 is set to the low level and fed to the inputs of the individual voltage select circuits VOLS1 to VOLS8. Here, the predecode signals Xp1 and Xp1* are set to the high level and the low level so as to select the word line W9 so that the corresponding isolating MOSFETs Q56 and Q57 of the voltage select circuit VOLS1 are turned ON. In the voltage select circuit VOLS1 having the isolating MOSFETs Q56 and Q57 turned ON, the high level of the node N1 is fed to the gates of the individual MOSFETs Q52 and Q53. As a result, the MOSFET Q52 of the output circuit INV2 is turned ON to start the charging operation of the word line W1 to the Vcc voltage through the terminal P1. At this time, the low level to be fed to the gate of the other MOSFET Q53 is set to a level higher than the Vss voltage by the action of the MOSFET Q57. Since, moreover, the MOSFET Q53 has its source at the Vee voltage, it is not completely cut off. As the word line has its level raised by the MOSFET Q52, however, the feedback MOSFET Q55 has its conductance increased, and said MOSFET Q53 has its gate forced to the Vee voltage so that it is completely cut off. At this time, the Vee voltage to be fed through the feedback MOSFET Q55 is prevented from being fed to the node N1 by the isolating MOSFET Q57. The word line thus unselected for the erasing operation is discharged to the Vcc voltage. The operations of the seven voltage select circuits for turning OFF the aforementioned MOSFETs Q56 and Q57 are similar to those of the case in which the isolating MOSFETs Q56 and Q57 are turned OFF when the select signal SEL is set to the select level.

According to the construction of the word driver of FIG. 2, the same effect as that of the word driver of FIG. 1 can be attained. By adopting the predecode system, moreover, one logic select circuit LOGS1, for example, can be shared among the plurality of voltage select circuits VOLS1 to VOLS8 to further reduce the area occupied by the word driver.

Figure 7:
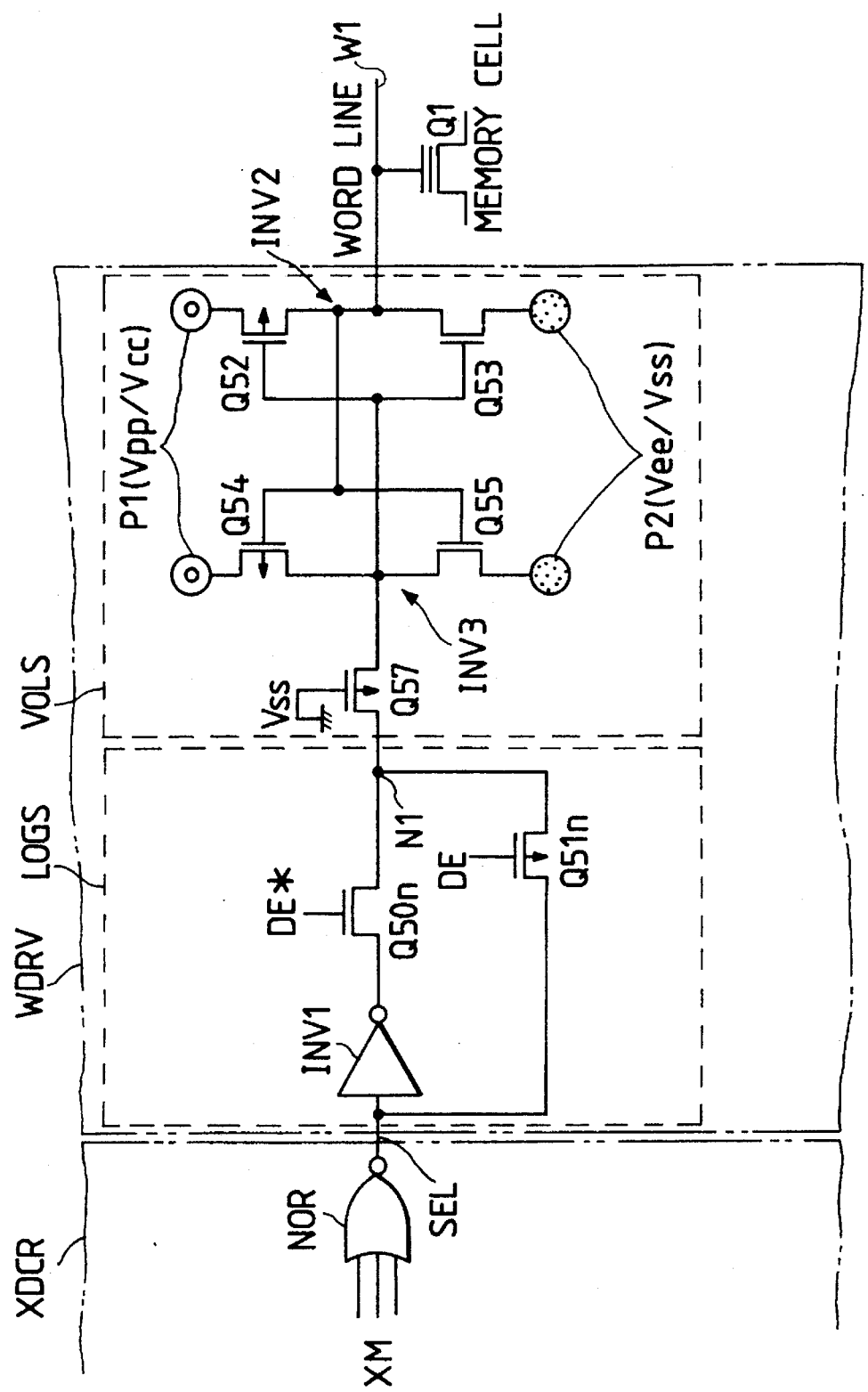
FIG. 7 is a circuit diagram showing still another word driver making use of a circuit in a static latch shape.

FIG. 7 is still another circuit diagram showing the word driver WDRV. The voltage select circuit VOLS in the construction, as shown, is constructed by connecting the feedback MOSFETs Q54 and Q55 in a push-pull manner to make a CMOS inverter INV3 and by connecting the CMOS inverter INV3 and the aforementioned output circuit INV2 in a static clutch shape in which their one-side inputs are mutually connected to the outputs. The circuit thus connected in the static clutch shape uses the voltage, which is to be fed to the aforementioned terminals P1 and P2, as the operating power. Like the foregoing embodiment, the first terminal P1 is fed with the Vpp voltage when in the programming operation and with the Vcc voltage when in the erasing and reading operations, and the second terminal P2 is fed with the Vee voltage when in the erasing operation and with the Vss operation when in the programming and reading operations. The output of the aforementioned CMOS inverter INV3 and the output node N1 of the logic select circuit LOGS are coupled to each other by inserting the aforementioned isolating MOSFET Q57 having its gate coupled to the Vss voltage. The conduction types of the MOSFETs Q50n and Q51n for selecting the inverted signal and the noninverted signal in the logic select circuit LOGS of FIG. 2 are individually made the N-channel type in a manner to correspond to the fact that the isolating MOSFET Q57 is of the P-channel type, so that the Vpp voltage and the Vee voltage may not be transmitted to the decoder XDCR.

The operations of the word driver shown in FIG. 7 are basically similar to those of the foregoing embodiment. When in the programming and reading operations, the MOSFET Q50n is turned ON, and the select signal SEL at the select level is logically inverted to the low level and is fed to the voltage select circuit VOLS. Then, the word line W1 is set through the terminal P1 to the Vpp voltage when in the programming operation and to the Vcc voltage when in the reading operation. When the select signal SEL at the unselect level is fed, the word line W1 is set to the Vss voltage through the terminal P2 when in both the programming and reading operations. When the MOSFET Q51n is turned ON in the erasing operation so that the select signal SEL at the high level is fed to the voltage select circuit VOLS, the word line is set to the Vee voltage through the terminal P2. When the select signal SEL at the unselected signal is fed in the erasing operation, the word line W1 is set to the Vcc voltage through the terminal P1. The actions of the feedback MOSFETs Q54 and Q55 in the aforementioned individual operations are similar to those of the aforementioned word driver. Since, however, the P-channel type isolating MOSFET Q57 is fed with both the Vee voltage and the Vpp voltage, the substantial isolations of the higher voltage line and the lower voltage line are realized by the coactions of the MOSFETs Q50n and Q51n. In other words, the isolations of the Vpp voltage are substantially carried out by the MOSFETs Q50n and Q51n.

Figure 8:
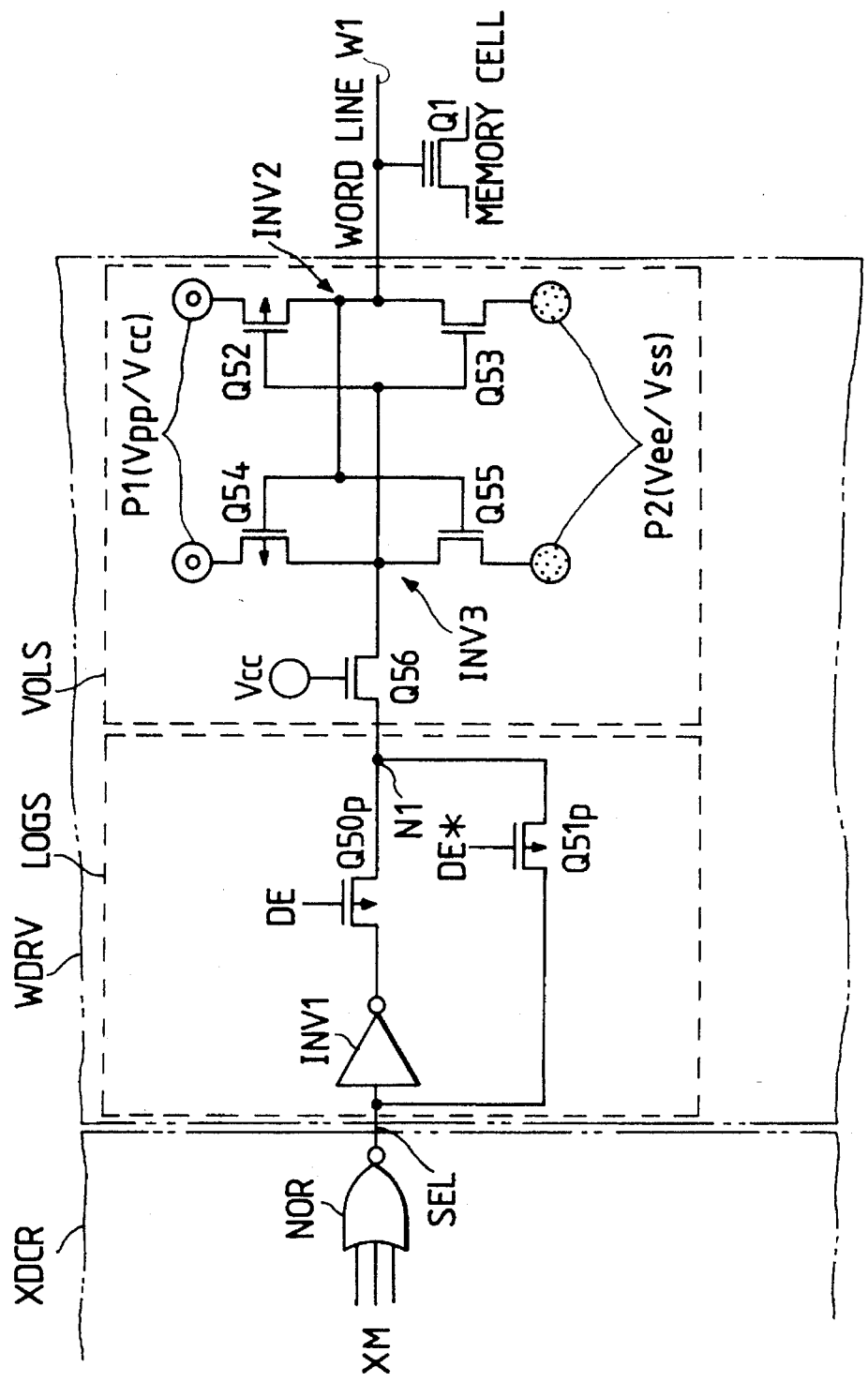
FIG. 8 is a circuit diagram showing a further word driver making use of a circuit in the static latch shape.

FIG. 8 is still another circuit diagram showing the word driver WDRV. The circuit shown in FIG. 8 is different from that of FIG. 7 in that the N-channel type isolating MOSFET Q56 having its gate coupled to the Vcc voltage is adopted so that the P-channel type MOSFETs Q50p and Q51p are accordingly adopted as the positive and negative logic selecting MOSFETs in the logic select circuit LOGS. In this embodiment, the isolation of the Vee voltage is substantially carried out by the MOSFETs Q50p and Q51p.

According to the aforementioned constructions of FIGS. 7 and 8, the number of elements composing the circuit can be made less than that of FIG. 1. In the point that the Vee voltage and the Vpp voltage are isolated from the address decoder, however, the CMOS transfer gate cannot be adopted in the circuit for selecting the positive logic and the negative logic at the word line selecting level by the logic select circuit LOGS, but the logic signal level to be fed to the voltage select circuit VOLS is undesirably shifted by the threshold voltage of the MOSFETs. Thus, the embodiments of FIGS. 1 and 2 are superior from the standpoint of the high-speed operation of the word driver.

Figure 9:
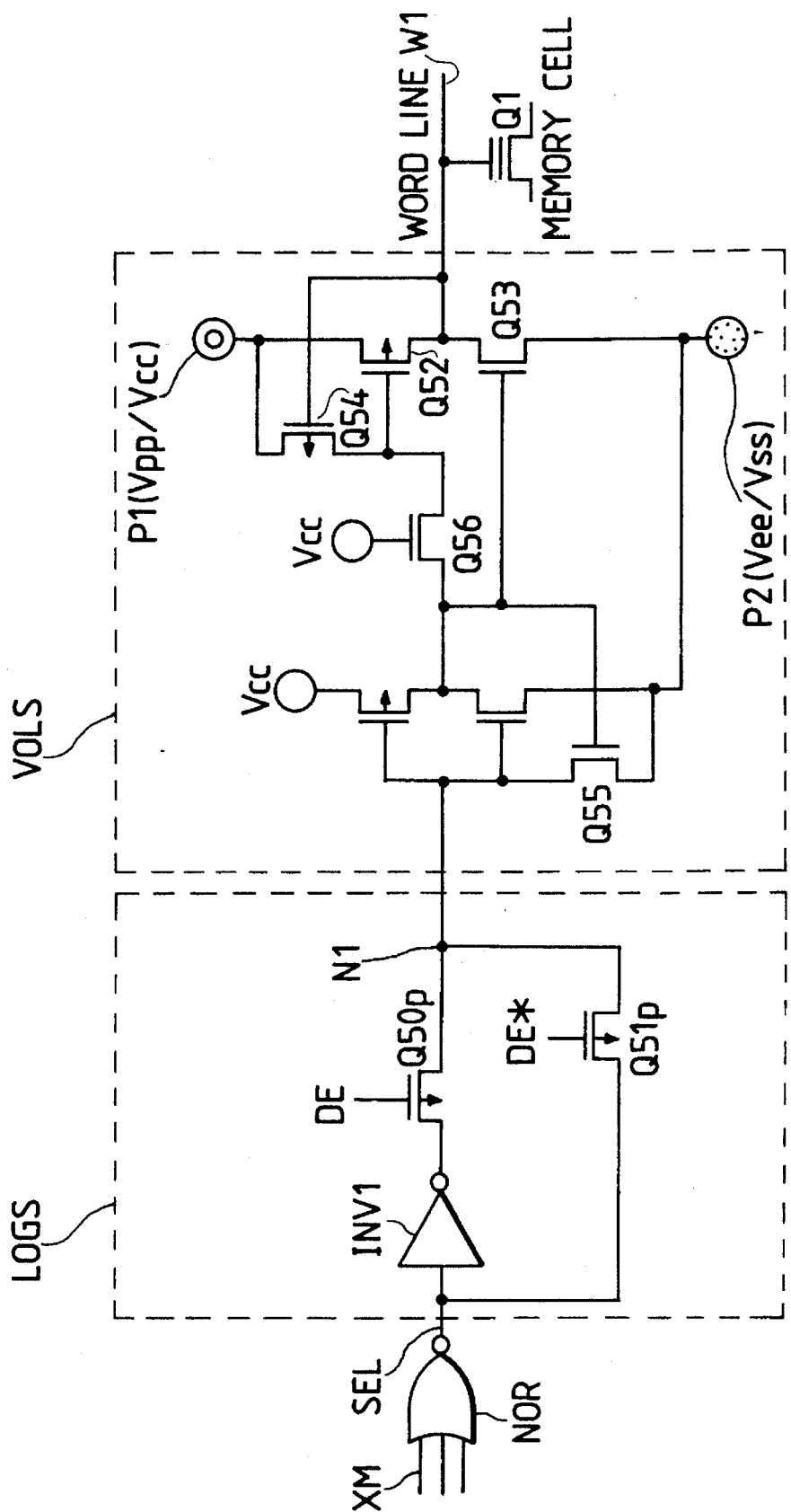
FIG. 9 is a circuit diagram showing a further word driver we have investigated in connection with the circuit FIG. 11.
Figure 11:
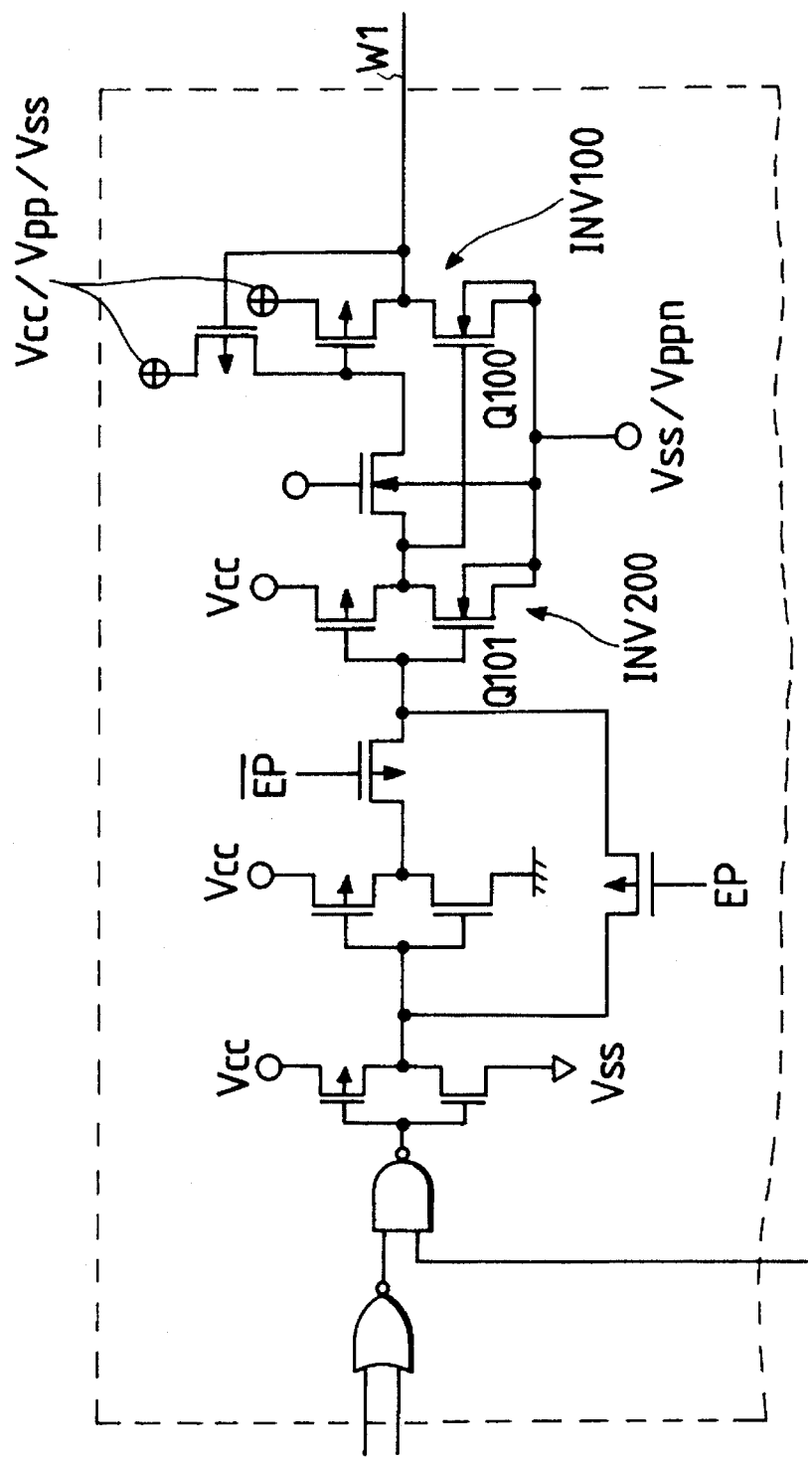
FIG. 11 is a circuit diagram showing a word driver of the prior art to be used in a negative voltage erasure.

FIG. 9 shows a word driver which has been investigated by us in connection with FIG. 11. The word driver shown in FIG. 9 is constructed by adding the feedback MOSFET Q55 for the Vee voltage between the second terminal P2 and the node N1. The feedback MOSFET for the Vpp voltage is designated at Q54. Since the Vee voltage is fed to the node N1 in this construction, the P-channel type MOSFETs Q50p and Q51p have to be adopted as the positive and negative logic selecting MOSFETs to isolate the Vee voltage. As a result, the word driver is difficult to have a high-speed operation, as described above, and the number of circuit composing elements is larger than that of the foregoing embodiments.

Figure 10:
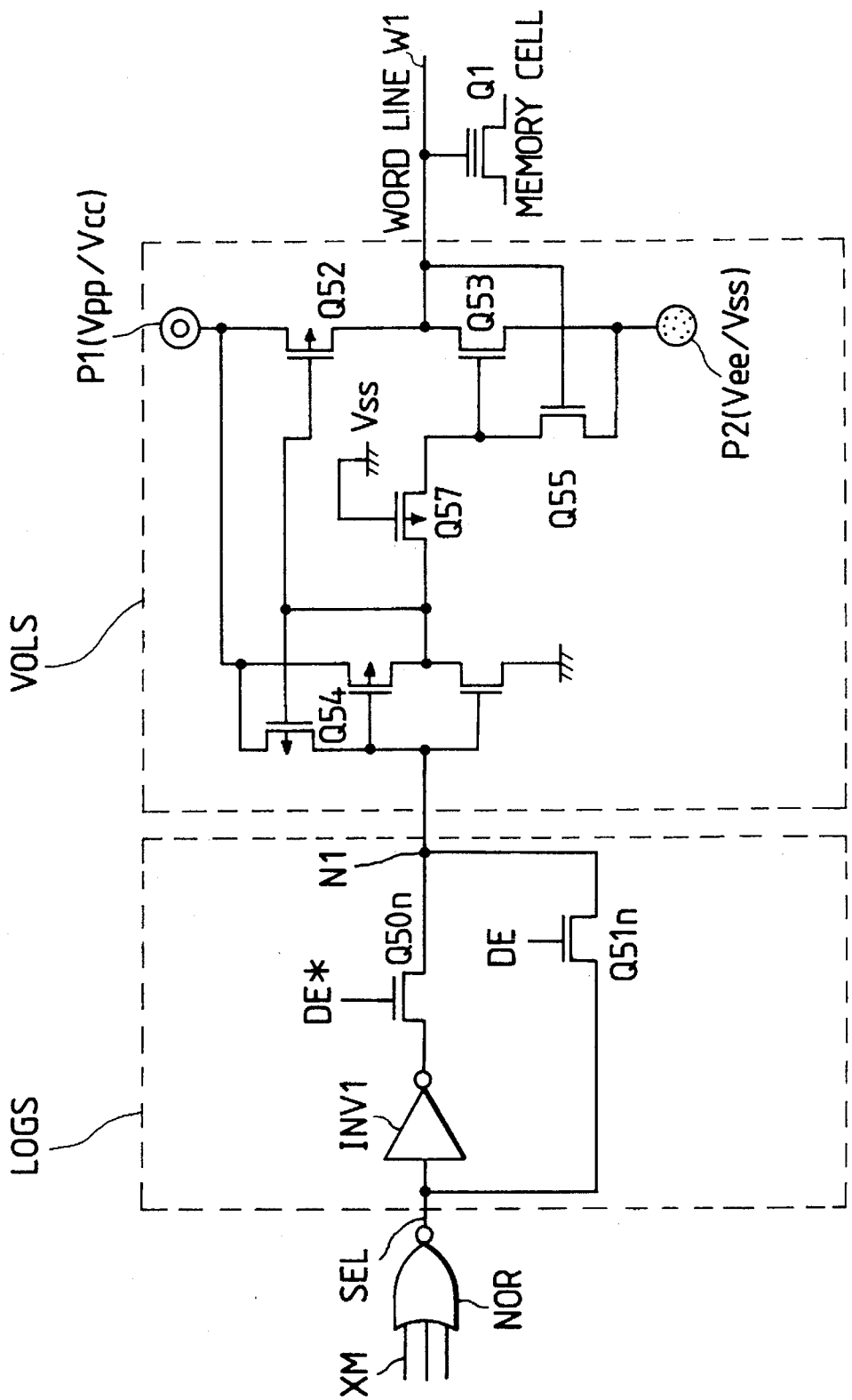
FIG. 10 is a circuit diagram showing a modification of the word driver of FIG. 11.

An embodiment, as shown in FIG. 10, is constructed by interposing the feedback MOSFET Q54 for the Vpp voltage between the node N1 and the first terminal P1. In this construction, the node N1 is fed with the Vpp voltage so that the N-channel type MOSFETs Q50n and Q51n have to be adopted as the MOSFETs for selecting the positive and negative logics at the word line selecting level, thereby to isolate the Vee voltage. As a result, the word driver is difficult to have a high-speed operation, as described above, and the circuit composing elements is also large.

Although our invention has been specifically described in connection with its embodiments, it should not be limited thereto but can naturally be modified in various manners without departing from the scope thereof. For example, the CMOS transfer gate, as shown in FIG. 1, can be changed into an N-channel type MOSFET. In this change, however, the logic signal to be fed to the voltage select circuit VOLS has its amplitude reduced. Moreover, the select level of the word line select signal SEL is hot limited to the high level. Moreover, the polarities of the first to fourth voltages can be inverted from those of the foregoing embodiments, and the conduction type of the MOSFETs can be accordingly inverted. Still moreover, the voltages to be fed to the aforementioned terminals P3 and P4 should not be limited to those of the foregoing embodiments, and the terminal P4 may be fed with a negative voltage such as the Vee voltage in the erasing operation.

Although our invention has been described herein before by exemplifying the flash memory according to the background field of application, the present invention can also be applied to not only such memory LSI but also a packaged memory of a logic LSI such as a microcomputer LSI. The present invention can be applied to the conditions, under which the word line of the memory cell to be selected for the erasing operation when in at least the electric erasing operation is fed from the word driver with the voltage which has a polarity different from that of the voltage to be fed to either the source or drain.

The effects to be obtained from a representative of the invention disclosed herein will be briefly described in the following.

(1) The voltage necessary for the programming and reading operations and for the erasing operation at the unit of word line can be selectively fed to the word lines by the word driver coupled to one of the word lines. As a result, the word drivers and the address decoders need not be constructed separately for the higher voltage line and the lower voltage line so that the chip area to be occupied by the word driver can be reduced.

(2) As shown in FIGS. 1 and 2, the two paths for transmitting the output of the logic select circuit are individually equipped in a symmetric manner with the output MOS transistors of different conduction types, the feedback MOS transistors, and the isolating MOS transistors. As a result, the second voltage such as the Vee voltage and the third voltage such as the Vpp voltage to be fed to the aforementioned paths through the feedback MOS transistors can be prevented without fail from being transmitted to the logic select circuit by the paired isolating MOS transistors of different conduction types. Since, moreover, the voltage select circuit is symmetrically constructed of the two transmission paths, such effect can be realized by a reduced number of circuit elements.

(3) Thanks to the above-specified effects, the circuit elements for selecting the positive logic and the negative logic for the output of the logic select circuit need not bear the voltage isolating function so that the CMOS transfer gates can be adopted as said circuit elements. As a result, the amplitude of the logic signals to be outputted from the logic select circuit can be maximized for the operating power voltage to make a contribution to the speed-up of the operation of the word driver.

(4) When the predecode system is adopted as one for selecting the word lines, a plurality of voltage select circuits have their inputs commonly connected with the output of one logic select circuit, as shown in FIG. 2, so that they may be individually selected by the predecode signals. As a result, the logic select circuit can be shared among the plurality of voltage select circuits so that the number of circuit composing elements can be drastically reduced in the entirety of the word driver.

(5) By connecting the output MOS transistors and the feedback MOS transistors in the static latch shape, the number of circuit composing elements of the word driver can be reduced.

What is claimed is:

1. A nonvolatile semiconductor memory comprising:

a plurality of word lines;

a plurality of memory cells, each of which is of one MOS transistor type having a floating gate, a control gate coupled to one of said word lines, a source and a drain;

address decode means for receiving address signals and for generating a select signal for selecting one of said plurality of word lines; and a plurality of word drivers coupled to said address decode means and at least one of said word lines for feeding one of first to fourth voltages selectively to the word lines coupled thereto, wherein said fourth voltage is at a circuit reference potential; said first voltage is at a potential having a predetermined potential difference from said fourth voltage; said second voltage has a polarity opposed to that of said first voltage; and said third voltage has the same polarity as that of said first voltage and has a far larger potential difference than said predetermined potential difference, and wherein each of said plurality of word drivers includes voltage generating means having a first terminal adapted to be fed with said third voltage in a program mode and with said first voltage in erase and read modes, and a second terminal adapted to be fed with said second voltage in the erase mode and with said fourth voltage in the program and read modes; and logic select means for switching the signal from said address decode means selectively into a positive or negative logic in dependence upon whether or not the mode is said erase mode and for outputting the switched signal.

2. The nonvolatile semiconductor memory according to claim 1, wherein said voltage generating means comprises an output circuit including: a first output MOS transistor of first conduction type having its first electrode coupled to said first terminal; and a second output MOS transistor of second conduction type having its first electrode coupled to said second terminal, and wherein each of said first and second output MOS transistors has its second electrode coupled to one of said word lines.

3. The nonvolatile semiconductor memory according to claim 2, wherein said voltage generating means further comprises: a first feedback MOS transistor of the first conduction type connected between said first terminal and the gate of said first output MOS transistor and having its gate coupled to said second electrode of the first output MOS transistor; and a second feedback MOS transistor of the second conduction type connected between said second terminal and the gate of said second output MOS transistor and having its gate coupled to said second electrode of the second output MOS transistor.

4. The nonvolatile semiconductor memory according to claim 3, wherein said voltage generating means further comprises: a first isolating MOS transistor of the second conduction type connected between the gate of said first output MOS transistor and the output of said logic select circuit and having its gate fed with said first voltage; and a second isolating MOS transistor of the first conduction type connected between the gate of said second output MOS transistor and the output of said logic select circuit and having its gate fed with said fourth voltage.

5. The nonvolatile semiconductor memory according to claim 4, wherein said logic select circuit includes: an inverter circuit for inverting the select signal coming from said address decode means; and switch means for outputting one of the select signal inverted by said inverter circuit and the non-inverted select signal.

6. The nonvolatile semiconductor memory according to claim 5, wherein each said erase mode, said program mode and said read mode is designated according to a command fed from the outside of said nonvolatile semiconductor memory.

7. The nonvolatile semiconductor memory according to claim 6, wherein said logic select means includes control means for feeding such a control signal to said logic select means that said non-inverted select signal may be outputted when said erase mode is designated by said command.

8. The nonvolatile semiconductor memory according to claim 7,
wherein said logic select means includes control means for feeding such a control signal to said logic select means that said inverted select signal may be outputted when said program and read modes are designated by said commands.

9. The nonvolatile semiconductor memory according to claim 8,
wherein said control means feeds said first and second terminals with said first to fourth voltages in accordance with the modes designated according to said commands.

10. The nonvolatile semiconductor memory according to claim 9,
wherein said plurality of voltage generating means are coupled to said logic select means,
wherein in said erase mode, said word driver coupled to at least one selected word line feeds said second voltage wherein said word drivers coupled to the unselected word lines feed said first voltage,
wherein in said program mode, said word driver coupled to said selected one word line feeds said third voltage whereas said word drivers coupled to said unselected word lines feed said fourth voltage, and
wherein in the read mode, said word driver coupled to said selected one word line feeds said first voltage whereas said word drivers coupled to said unselected word lines feed said fourth voltage.

11. A microcomputer system comprising:
a microcomputer;
bus means for transferring an address signal, a data and a control signal; and
a nonvolatile semiconductor memory coupled to said bus means and including:
a plurality of word lines;
a plurality of memory cells, each of which is of one MOS transistor type having a floating gate, a control gate coupled to one of said word lines, a source and a drain;
address decode means for receiving address signals from said microprocessor, for generating a select signal for selecting one of said plurality of word lines; and
a plurality of word drivers coupled to said address decode means and at least one of said word lines for feeding one of first to fourth voltages selectively to the word lines coupled thereto,
wherein said fourth voltage is at a circuit reference potential; said first voltage is at a potential having a predetermined potential difference from said fourth voltage; said second voltage has a polarity opposed to that of said first voltage; and said third voltage has the same polarity as that of said first voltage and has a far larger potential difference than said predetermined potential difference, and
wherein each of said plurality of word drivers includes voltage generating means having a first terminal adapted to be fed with said third voltage in a program mode and with said first voltage in erase and read modes, and a second terminal adapted to be fed with said second voltage in the erase mode and with said fourth voltage in the program and read modes; and logic select means for switching the signal from said address decode means selectively into a positive or negative logic in dependence upon whether or not the mode is said erase mode and for outputting the switched signal.

12. The microcomputer system according to claim 11,
wherein said voltage generating means comprises an output circuit including: a first output MOS transistor of first conduction type having its first electrode coupled to said first terminal; and a second output MOS transistor of second conduction type having its first electrode coupled to said second terminal, and
wherein each of said first and second output MOS transistors has its second electrode coupled to one of said word lines.

13. The microcomputer system according to claim 12,
wherein said voltage generating means further comprises: a first feedback MOS transistor of the first conduction type connected between said first terminal and the gate of said first output MOS transistor and having its gate coupled to said second electrode of the first output MOS transistor; and a second feedback MOS transistor of the second conduction type connected between said second terminal and the gate of said second output MOS transistor and having its gate coupled to said second electrode of the second output MOS transistor.

14. The microcomputer system according to claim 13,
wherein said voltage generating means further comprises: a first isolating MOS transistor of the second conduction type connected between the gate of said first output MOS transistor and the output of said logic select circuit and having its gate fed with said first voltage; and a second isolating MOS transistor of the first conduction type connected between the gate of said second output MOS transistor and the output of said logic select circuit and having its gate fed with said fourth voltage.

15. The microcomputer system according to claim 14,
wherein said logic select circuit includes: an inverter circuit for inverting the select signal coming from said address decode means; and switch means for outputting one of the select signal inverted by said inverter circuit and the non-inverted select signal.

16. The microcomputer system according to claim 15,
wherein each said erase mode, said program mode and said read mode is designated according to a command fed from said microprocessor.

17. The microcomputer system according to claim 16,
wherein said logic select means includes control means for feeding such a control signal to said logic select means that said non-inverted select signal may be outputted when said erase mode is designated by said command.

18. The microcomputer system according to claim 17,
wherein said logic select means includes control means for feeding such a control signal to said logic select means that said inverted select signal may be outputted when said program and read modes are designated by said commands.

19. The microcomputer system according to claim 18,
wherein said control means feeds said first and second terminals with said first to fourth voltages in accordance with the modes designated according to said commands.

20. The microcomputer system according to claim 19,
wherein said plurality of voltage generating means are coupled to said logic select means,
wherein in said erase mode, said word driver coupled to at least one selected word line feeds said second voltage wherein said word drivers coupled to the unselected word lines feed said first voltage, wherein in said program mode, said word driver coupled to said selected one word line feeds said third voltage whereas said word drivers coupled to said unselected word lines feed said fourth voltage, and wherein in the read mode, said word driver coupled to said selected one word line feeds said first voltage whereas said word drivers coupled to said unselected word lines feed said fourth voltage.

* * * * *